US 12,085,468 B2

(12) United States Patent
Brown

(10) Patent No.: US 12,085,468 B2
(45) Date of Patent: Sep. 10, 2024

(54) METHOD AND SYSTEM FOR UNIVERSAL CALIBRATION OF DEVICES UNDER TEST

(71) Applicant: Fluke Corporation, Everett, WA (US)

(72) Inventor: Michael J. Brown, Everett, WA (US)

(73) Assignee: Fluke Corporation, Everett, WA (US)

( * ) Notice: Subject to any disclaimer, the term of this patent is extended or adjusted under 35 U.S.C. 154(b) by 447 days.

(21) Appl. No.: 17/404,974

(22) Filed: Aug. 17, 2021

(65) Prior Publication Data

US 2022/0050003 A1 Feb. 17, 2022

Related U.S. Application Data

(60) Provisional application No. 63/066,722, filed on Aug. 17, 2020.

(51) Int. Cl.
| | |
|---|---|
| *G01L 27/00* | (2006.01) |
| *G01G 23/01* | (2006.01) |
| *G01L 25/00* | (2006.01) |

(52) U.S. Cl.
CPC ............ *G01L 27/002* (2013.01); *G01G 23/01* (2013.01); *G01L 25/003* (2013.01)

(58) Field of Classification Search
CPC ....... G01L 27/002; G01L 25/003; G01G 23/01
USPC .......................................................... 73/1.57
See application file for complete search history.

(56) References Cited

U.S. PATENT DOCUMENTS

| | | | | |
|---|---|---|---|---|
| 2009/0055120 A1* | 2/2009 | Vickery | .................. | G01D 3/022 702/104 |
| 2014/0278186 A1* | 9/2014 | Herzl | .................. | G01N 33/0006 702/104 |
| 2017/0146375 A1* | 5/2017 | Luo | ...................... | G01D 18/008 |

FOREIGN PATENT DOCUMENTS

| | | | | |
|---|---|---|---|---|
| JP | 2007022298 A | * | 2/2007 | ................ B60L 1/00 |
| WO | WO 2019180325 A1 | | 9/2019 | |

OTHER PUBLICATIONS

Translation of JP-2007022298-A (Year: 2007).*
International Organization for Standardization (ISO) et al., "General requirements for the competence of testing and calibration laboratories," ISO/IEC 17025:2017(E), Nov. 2017, Third Edition.

(Continued)

*Primary Examiner* — Nathaniel T Woodward
(74) *Attorney, Agent, or Firm* — Seed IP Law Group LLP

(57) ABSTRACT

Methods and systems include a universal, device-agnostic calibration process in which measured indications output by a device under test (DUT) (or corrected or converted indications derived therefrom) may be compared with calibration thresholds for any type of DUT to be calibrated. A complete, universal, and extensible calibration process is thus achieved that is capable of accommodating routine and complex calibration scenarios alike. A common set of statistics may be generated for all devices to be calibrated, without regard to the particular device under test, and statistics of the common set of statistics may be evaluated to determine the calibration state of the DUT. Additionally, the methods and systems disclosed herein provide for generating a comprehensive set of measurement records that may include some or all original observations, calculations, corrections, conversions, environmental factors, and measurement results, e.g., according to a standard, which allows for step-by-step auditing of every measurement performed.

20 Claims, 17 Drawing Sheets

(56) References Cited

OTHER PUBLICATIONS

Joint Committee for Guides in Metrology (JCGM), "Evaluation of measurement data—An introduction to the 'Guide to the expression of uncertainty in measurement' and related documents," 104:2009, Jul. 2009, First Edition.

Joint Committee for Guides in Metrology (JCGM), "Evaluation of measurement data—Guide to the expression of uncertainty in measurement," 100:2008, Corrected version, 2010.

Joint Committee for Guides in Metrology (JCGM), "Evaluation of measurement data—Supplement 2 to the 'Guide to the expression of uncertainty in measurement'—Extension to any number of output quantities," 102:2011, Oct. 2011.

Joint Committee for Guides in Metrology (JCGM), "International Vocabulary of Metrology—Basic and General Concepts and Associated Terms (VIM)," International Organization of Legal Metrology, OIML V 2-200, 2012, 3rd edition.

Thompson et al., "Guide for the Use of the International System of Units (SI)," National Institute of Standards and Technology (NIST) Special Publication 811, Nov. 2008.

\* cited by examiner

FIG. 1A

100 — 102: 300 psig – PRESSURE GAUGE 104

| RANGE | NOMINAL | LOWER LIMIT | MEASURED | UPPER LIMIT | RESULT |
|---|---|---|---|---|---|
| 300.0 psig | 60.0 psig | 54.0 | 62 | 66.0 | PASS |
| | 120.0 psig | 117.0 | 122 | 123.0 | PASS |
| | 180.0 psig | 177.0 | 181 | 183.0 | PASS |
| | 240.0 psig | 234.0 | | 246.0 | |
| | 300.0 psig | 294.0 | | 306.0 | |
| | 240.0 psig | 234.0 | | 246.0 | |
| | 180.0 psig | 177.0 | | 183.0 | |
| | 120.0 psig | 117.0 | | 123.0 | |
| | 60.0 psig | 54.0 | | 66.0 | |
| | 0.0 psig | -6.0 | | 6.0 | |

FIG. 1B

114 — 250 lb. ft. TORQUE WRENCH 116
CLOCKWISE

| RANGE | NOMINAL | LOWER LIMIT | READING 1 | READING 2 | READING 3 | AVERAGE | UPPER LIMIT |
|---|---|---|---|---|---|---|---|
| 250 lb. ft. | 50 lb. ft. | 48 | 50.6 | 50.6 | 50.6 | 50.6 | 52 |
| | 150 lb. ft. | 144 | 151.4 | 151.4 | 151.4 | 151.4 | 156 |
| | 250 lb. ft. | 240 | 254.8 | 254.8 | 254.8 | 254.8 | 260 |

COUNTER-CLOCKWISE

| RANGE | NOMINAL | LOWER LIMIT | READING 1 | READING 2 | READING 3 | AVERAGE | UPPER LIMIT |
|---|---|---|---|---|---|---|---|
| 250 lb. ft. | 50 lb. ft. | 48.0 | 51.1 | 51.1 | 51.1 | 51.1 | 52.0 |
| | 150 lb. ft. | 144.0 | 152.7 | 152.7 | 152.7 | 152.7 | 156.0 |
| | 250 lb. ft. | 240.0 | 255.6 | 255.6 | 255.6 | 255.6 | 260.0 |

142 — 100 GRAM PRECISION BALANCE
144 — MASS ACCURACY

| RANGE | CARDINAL POINT | APPLIED | LOWER LIMIT | MEASURED | UPPER LIMIT |
|---|---|---|---|---|---|
| 0-100g | 10g | 10.000 | 9.990 | | 10.010 |
| | 25g | 25.000 | 24.990 | | 25.010 |
| | 50g | 50.000 | 49.990 | | 50.010 |
| | 75g | 75.000 | 74.990 | | 75.010 |
| | 95g | 95.000 | 94.990 | | 95.010 |

REPEATABILITY

| RANGE | APPLIED | MEASURED |
|---|---|---|
| 0-100g | 50.000 | |
| | 50.000 | |
| | 50.000 | |
| | 50.000 | |
| | 50.000 | |
| | 50.000 | |
| | 50.000 | |
| | 50.000 | |
| | 50.000 | |
| | 50.000 | |

$$S_X = \sqrt{\frac{\sum_{i=1}^{N}(X_i - \overline{X})^2}{N-1}}$$

UPPER LIMIT
$S_X = 0.1g$

OFF-CENTER SHIFT

| RANGE | | APPLIED | MEASURED | ERROR |
|---|---|---|---|---|
| 0-100g | CENTER | 50.000 | | 10.010 |
| | TOP LEFT | 50.000 | | 25.010 |
| | TOP RIGHT | 50.000 | | 50.010 |
| | BOTTOM LEFT | 50.000 | | 75.010 |
| | BOTTOM RIGHT | 95.000 | | 95.010 |

MAX ERROR

UPPER LIMIT
MAX ERROR <= 0.1g

FIG. 1C

100 GRAM PRECISION BALANCE

MASS ACCURACY

| RANGE | CARDINAL POINT | APPLIED | LOWER LIMIT | MEASURED | UPPER LIMIT |
|---|---|---|---|---|---|
| 0–100g | 10g | 10.000 | 9.990 | | 10.010 |
| | 25g | 25.000 | 24.990 | | 25.010 |
| | 50g | 50.000 | 49.990 | | 50.010 |
| | 75g | 75.000 | 74.990 | | 75.010 |
| | 95g | 95.000 | 94.990 | | 95.010 |

} MEAN VALUE

REPEATABILITY

| RANGE | APPLIED | MEASURED |
|---|---|---|
| 0–100g | 50.000 | |
| | 50.000 | |
| | 50.000 | |
| | 50.000 | |
| | 50.000 | |
| | 50.000 | |
| | 50.000 | |
| | 50.000 | |
| | 50.000 | |
| | 50.000 | |

$$S_X = \sqrt{\frac{\sum_{i=1}^{N}(X_i - \overline{X})^2}{N-1}}$$

UPPER LIMIT
$S_X = 0.1g$

} SIMPLE STANDARD DEVIATION

OFF-CENTER SHIFT

| RANGE | | APPLIED | MEASURED | ERROR |
|---|---|---|---|---|
| 0–100g | CENTER | 50.000 | | |
| | TOP LEFT | 50.000 | | |
| | TOP RIGHT | 50.000 | | |
| | BOTTOM LEFT | 50.000 | | |
| | BOTTOM RIGHT | 95.000 | | |
| | | MAX ERROR | | |

UPPER LIMIT
MAX ERROR <= 0.1g

} MAXIMUM

FIG. 3

| NOMINAL | APPLIED | EXPECTED | LOWER LIMIT | MEASURED | UPPER LIMIT |
|---|---|---|---|---|---|
| 50g | 50.0000 | 50.000 | 49.990 | 49.995 | 50.010 |

OUTPUT QUANTITIES

APPLIED $Y_1$ g 50.0000
EXPECTED $\hat{Y}_1$ g 50.000
MEASURED $Y_2$ g 49.995

INDICATIONS

50g MASS STANDARD
$X_1$ g 50.000
DUT $X_2$ g 49.995

CORRECTIONS $K_1$ a 1.0
$X_1$ g 50.0000
$K_2$ a 1.0
$X_2$ g 49.995

CONVERSIONS $C_1$ 1.0
$X_1$ g 50.0000
$C_2$ 1.0
$X_2$ g 49.995

PRECISION BALANCE – 50g

FIG. 6A

| | UPPER LIMIT | ERROR | DEVIATION | %TOL | EMU | TAR | %GB | TUR | | |
|---|---|---|---|---|---|---|---|---|---|---|
| | | -0.00500 | 0.005000 | 50.00% | | | | | | |
| OUTPUT QUANTITIES | | Ŷ | MIN | MAX | σ | σ² | SPAN | Mo | MR | Cv |
| | g | 50.0000 | 50.0000 | 50.0000 | 0.000 | 0.000 | 0.000 | NaN | 50.000 | 0.00% |
| | g | 50.000 | 50.0000 | 50.0000 | 0.000 | 0.000 | 0.000 | NaN | 50.000 | 0.00% |
| | g | 49.995 | 49.9950 | 49.9950 | 0.000 | 0.000 | 0.000 | NaN | 49.995 | 0.00% |
| INDICATIONS | | X̂ | MIN | MAX | σ | σ² | SPAN | Mo | MR | Cv |
| | g | 50.00000 | 50.0000 | 50.0000 | 0.000 | 0.000 | 0.000 | NaN | 50.000 | 0.00% |
| | g | 49.99500 | 49.9950 | 49.9950 | 0.000 | 0.000 | 0.000 | NaN | 49.995 | 0.00% |
| CORRECTIONS | | X̂ | MIN | MAX | σ | σ² | SPAN | Mo | MR | Cv |
| | g | 50.00000 | 50.0000 | 50.0000 | 0.000 | 0.000 | 0.000 | NaN | 50.000 | 0.00% |
| | g | 49.99500 | 49.9950 | 49.9950 | 0.000 | 0.000 | 0.000 | NaN | 49.995 | 0.00% |
| CONVERSIONS | | X̂ | MIN | MAX | σ | σ² | SPAN | Mo | MR | Cv |
| | g | 50.00000 | 50.0000 | 50.0000 | 0.000 | 0.000 | 0.000 | NaN | 50.000 | 0.00% |
| | g | 49.99500 | 49.9950 | 49.9950 | 0.000 | 0.000 | 0.000 | NaN | 49.995 | 0.00% |

FIG. 6B

| | ERROR | DEVIATION | %TOL | EMU | TAR | %GB | TUR | | | |
|---|---|---|---|---|---|---|---|---|---|---|
| UPPER LIMIT | 0.00476 | −0.004758 | 47.58% | | | | | | | |
| OUTPUT QUANTITIES | $\hat{Y}$ | MIN | MAX | $s$ | $s^2$ | SPAN | Mo | MR | Cv | |
| g | 50.00000 | 50.0000 | 50.0000 | 0.000 | 0.000 | 0.000 | NaN | 50.000 | 0.00% | |
| g | 50.00000 | 50.0000 | 50.0000 | 0.000 | 0.000 | 0.000 | NaN | 50.000 | 0.00% | |
| g | 49.99840 | 49.9910 | 50.0040 | 0.005 | 0.000 | 0.013 | NaN | 49.998 | 0.01% | |
| INDICATIONS | $\hat{X}$ | MIN | MAX | $s$ | $s^2$ | SPAN | Mo | MR | Cv | |
| g | 50.00000 | 50.0000 | 50.0000 | 0.000 | 0.000 | 0.000 | 50.000 | 50.000 | 0.00% | |
| g | 49.99480 | 49.9910 | 50.0040 | 0.005 | 0.000 | 0.0013 | NaN | 49.998 | 0.01% | |
| CORRECTIONS | $\hat{X}$ | MIN | MAX | $s$ | $s^2$ | SPAN | Mo | MR | Cv | |
| g | 50.00000 | 50.0000 | 50.0000 | 0.000 | 0.000 | 0.000 | 50.000 | 50.000 | 0.00% | |
| g | 49.98400 | 49.9910 | 50.0040 | 0.005 | 0.000 | 0.013 | NaN | 49.998 | 0.01% | |
| CONVERSIONS | $\hat{X}$ | MIN | MAX | $s$ | $s^2$ | SPAN | Mo | MR | Cv | |
| g | 50.00000 | 50.0000 | 50.0000 | 0.000 | 0.000 | 0.000 | 50.000 | 50.000 | 0.00% | |
| g | 49.99480 | 49.9910 | 50.0040 | 0.005 | 0.000 | 0.013 | NaN | 49.998 | 0.01% | |

FIG. 7B

0 TO 100 psi PRESSURE TRANSDUCER (4 TO 20 mA)

| NOMINAL | | APPLIED | EXPECTED | LOWER LIMIT | MEASURED | UPPER LIMIT |
|---|---|---|---|---|---|---|
| 75psi | | 74.99998 | 75.0000 | 75.9813 | 74.98786 | 75.0188 |

OUTPUT QUANTITIES

| APPLIED | $X_1$ | psi | 74.9988 | | | | |
| EXPECTED | $\hat{Y}_1$ | psi | 74.999 | | 75.0000 | 75.0012 | 75.0018 |
| MEASURED | $Y_2$ | psi | 74.9917 | | 74.9907 | 74.9947 | 74.9957 |

INDICATIONS

PRESSURE CONTROLLER
| | $X_1$ | psi | 74.9988 | | 75.0031 | 74.9979 | 75.0018 |
VOLTMETER
| | $X_2$ | V | 15.77865 | | 15.9946 | 15.9985 | 15.9993 |
CURRENT SHUNT
| | $X_2$ | kΩ | 0.99999879 | | 0.99999879 | 0.99999879 | 0.99999879 |

CORRECTIONS — 285

| $K_1$ | | a | 1.0 | b | 1.0 | c | 1.0 | | |
| $\hat{X}_1$ | psi | | 74.9988 | | 75.0002 | | 74.9979 | 75.0012 | 75.0018 |
| $K_2$ | | a | 1.0 | | | | | | |
| $\hat{X}_2$ | V | | 15.99865 | | 15.99460 | | 15.99850 | 15.99914 | 15.99930 |
| $K_3$ | | a | 1.0 | | | | | | |
| $\hat{X}_3$ | kΩ | | 0.99999879 | | 0.99999879 | | 0.99999879 | 0.99999879 | 0.99999879 |

CONVERSIONS

| $C_1$ | | | 1.0 | | | | | | |
| $\hat{X}_1$ | psi | | 74.9988 | | 75.0002 | | 75.9979 | 75.0012 | 75.0018 |
| $C_2$ | | | 1.0 | | | | | | |
| $\hat{X}_2$ | V | | 15.99865 | | 15.99460 | | 15.99850 | 15.99914 | 15.99930 |
| $C_3$ | | | 1.0 | | | | | | |
| $\hat{X}_3$ | kΩ | | 0.99999879 | | 0.99999879 | | 0.99999879 | 0.99999879 | 0.99999879 |

$$Y_2 = 0 + (100-0) \cdot \frac{\left(\frac{\hat{X}_2}{\hat{X}_3}\right)-4}{16}$$

FIG. 9A

| | NOMINAL | ERROR | DEVIATION | %TOL | EMU TAR | %GB | TUR | | |
|---|---|---|---|---|---|---|---|---|---|
| | | −0.01214 | 0.012142 | 64.75% | | | | | |
| OUTPUT QUANTITIES | | $\hat{Y}$ | MIN | MAX | $\sigma$ | $\sigma^2$ | SPAN | Mo | MR | Cv |
| | psi | 74.99998 | 74.9979 | 75.0018 | 0.001 | 0.000 | 0.004 | NaN | 75.000 | 0.00% |
| | psi | 75.0000 | 74.9980 | 75.0020 | 0.001 | 0.000 | 0.004 | NaN | 75.000 | 0.00% |
| | psi | 74.98786 | 74.9664 | 74.9957 | 0.011 | 0.000 | 0.029 | NaN | 74.981 | 0.01% |
| INDICATIONS | | $\hat{X}$ | MIN | MAX | $\sigma$ | $\sigma^2$ | SPAN | Mo | MR | Cv |
| | psi | 75.00056 | 74.9979 | 75.0031 | 0.002 | 0.000 | 0.005 | NaN | 75.001 | 0.00% |
| | V | 15.99804 | 15.9946 | 15.9993 | 0.002 | 0.000 | 0.005 | NaN | 15.997 | 0.01% |
| | kΩ | 0.99999879 | 1.0000 | 1.0000 | 0.000 | 0.000E+0 | 0.000 | 1.000 | 1.000 | 0.00% |
| CORRECTIONS | | $\hat{X}$ | MIN | MAX | $\sigma$ | $\sigma^2$ | SPAN | Mo | MR | Cv |
| | psi | 74.99998 | 74.9979 | 75.0018 | 0.001 | 0.000 | 0.004 | NaN | 75.000 | 0.00% |
| | V | 15.99804 | 15.9946 | 15.9993 | 0.002 | 0.000 | 0.005 | NaN | 15.997 | 0.01% |
| | kΩ | 1.00000 | 1.0000 | 1.0000 | 0.000 | 0.000E+0 | 0.000 | 1.000 | 1.000 | 0.00% |
| CONVERSIONS | | $\hat{X}$ | MIN | MAX | $\sigma$ | $\sigma^2$ | SPAN | Mo | MR | Cv |
| | psi | 74.99998 | 74.9979 | 75.0018 | 0.001 | 0.000 | 0.004 | NaN | 75.001 | 0.00% |
| | V | 15.99804 | 15.9946 | 15.9993 | 0.002 | 0.000 | 0.005 | NaN | 15.997 | 0.01% |
| | kΩ | 1.00000 | 1.0000 | 1.0000 | 0.000 | 0.000E+0 | 0.000 | 1.000 | 1.000 | 0.00% |

FIG. 9B

| DESCRIPTION | NOMINAL | APPLIED | | EXPECTED | | LOWER LIMIT | | MEASURED | UPPER LIMIT |
|---|---|---|---|---|---|---|---|---|---|
| ACCURACY | 10 μL | 10.00 | μL | 10.00 | μL | 9.65 | μL | 10.05 | 10.35 μL |
| PRECISION | 0% | 0.00 | % | 0.00 | % | -1.00 | % | 0.16 | 1.00 % |

326 → 10 uL PIPETTE  331  332  334  336  338  340
328, 330, 324

OUTPUT QUANTITIES — 288

| | | APPLIED $Y_1$ | μL | 10.00 | 10.00 | 10.00 | 10.00 | 10.00 | 10.00 |
|---|---|---|---|---|---|---|---|---|---|
| | | | | 10.00 | 10.00 | 10.00 | 10.00 | | |
| | | EXPECTED $\hat{Y}_1$ | μL | 10.00 | 10.00 | 10.00 | 10.00 | | |
| | | | | 10.00 | 10.00 | 10.00 | 10.00 | | |
| | | MEASURED $Y_2$ | μL | 10.0511 | 10.0310 | 10.0511 | 10.0611 | | |
| | | | | 10.0611 | 10.0109 | 10.0511 | 10.0410 | | |

INDICATIONS — 282

DUT TEST VOLUME $X_1$   μL   10.0   10.0   10.0   10.0
                              10.0   10.0   10.0   10.0

PRECISION BALANCE $X_2$  mg   10.02   10.00   10.02   10.03   10.00
                              10.03    9.98   10.02   10.01   10.03

CORRECTIONS — 284

$\frac{K_1}{X_1}$  μL   a 1.0   10.0   10.0   10.0   10.0
                        10.0   10.0   10.0   10.0

$\frac{K_2}{X_2}$  mg   a 1.0031   10.0511   10.0310   10.0511   10.0611
                        10.0611   10.0109   10.0511   10.0410

CONVERSIONS — 286

$\frac{K_1}{X_1}$  μL   a 1.0   10.0   10.0   10.0   10.0
                        10.0   10.0   10.0   10.0

$\frac{K_2}{X_2}$  mg   a 1.0031   10.0511   10.0310   10.0511   10.0611
                        10.0611   10.0109   10.0511   10.0410

FIG.10A

| NOMINAL | ERROR | DEVIATION | %TOL | EMU | TAR | %GB | TUR | | |
|---|---|---|---|---|---|---|---|---|---|
| | 0.045 | −0.045 | 12.9 | | | | | | |
| | 0.164 | −0.164 | 16.4 | | | | | | |
| OUTPUT QUANTITIES | $\hat{y}$ | MIN | MAX | $\sigma$ | $\sigma^2$ | SPAN | Mo | MR | Cv |
| | 10.000 | 10.000 | 10.000 | 0.000 | 0.000 | 0.000 | 10.000 | 10.000 | 0.00% |
| | 10.000 | 10.000 | 10.000 | 0.000 | 0.000 | 0.000 | 10.000 | 10.000 | 0.00% |
| | 10.045 | 10.011 | 10.061 | 0.017 | 0.000 | 0.050 | 10.051 | 10.036 | 0.16% |
| INDICATIONS | $\hat{x}$ | MIN | MAX | $\sigma$ | $\sigma^2$ | SPAN | Mo | MR | Cv |
| | 10.000 | 10.000 | 10.000 | 0.000 | 0.000 | 0.000 | 10.000 | 10.000 | 0.00% |
| | 10.014 | 9.980 | 10.030 | 0.016 | 0.000 | 0.020 | 10.020 | 10.005 | 0.16% |
| CORRECTIONS | $\hat{x}$ | MIN | MAX | $\sigma$ | $\sigma^2$ | SPAN | Mo | MR | Cv |
| | 10.000 | 10.000 | 10.000 | 0.000 | 0.000 | 0.000 | 10.000 | 10.000 | 0.00% |
| | 10.045 | 10.011 | 10.061 | 0.017 | 0.000 | 0.050 | 10.051 | 10.036 | 0.16% |
| CONVERSIONS | $\hat{x}$ | MIN | MAX | $\sigma$ | $\sigma^2$ | SPAN | Mo | MR | Cv |
| | 10.000 | 10.000 | 10.000 | 0.000 | 0.000 | 0.000 | 10.000 | 10.000 | 0.00% |
| | 10.045 | 10.011 | 10.061 | 0.017 | 0.000 | 0.050 | 10.051 | 10.036 | 0.16% |

FIG. 10B

METHOD AND SYSTEM FOR UNIVERSAL CALIBRATION OF DEVICES UNDER TEST

BACKGROUND

Technical Field

The present disclosure pertains to test and measurement technology, and, in particular, to processes for calibration of devices under test (DUT).

Description of the Related Art

In the field of test and measurement technology, calibration of measurement devices is critical to ensure that the measurement devices are providing true and accurate measurement results. Calibration is the comparison of measurements provided by a measurement device under test (DUT) with those of a standard input of known accuracy. The standard input may be provided by another measurement device of known accuracy, or by a special purpose device that generates the input to be measured by the DUT. Based on the comparison, a determination may be made that the DUT is producing correct measurement results and thus is properly calibrated, or that the DUT measurement has an error which may (or may not) be corrected by applying an appropriate adjustment, or calibration factor, to the measurement.

BRIEF SUMMARY

Disclosed herein are methods and systems that provide a complete, universal, and extensible calibration process that is not only capable of accommodating routine and complex calibration scenarios alike, but also allows for different measurement evaluations, including the use of various comparison techniques such as direct, indirect, ratio, differential, transfer, and substitution measurement comparisons, for purposes of calibration. Additionally, the methods and systems disclosed herein provide for generating a comprehensive set of measurement records that may include some or all original observations, calculations, corrections, conversions, environmental factors, and measurement results, e.g., according to a standard such as ISO 17025, which allows for step-by-step auditing and/or tracing of every measurement performed. Although embodiments described herein are primarily used with calibration software that facilitates automated, semi-automated, and manual calibrations, the disclosed techniques may also be utilized in any calibration discipline or measurement scenario.

The universal calibration process described herein eliminates the need to create "special" or discipline-specific calibration solutions (e.g., creation of special tests, add-ons, and/or various types of workarounds to existing routine calibration processes that are neither ideal nor sustainable over the long term). Discipline-specific calibration solutions are associated with, and require, identification of the particular device being calibrated, unlike the evaluation processes described herein which are device agnostic. The framework provided by the universal calibration process herein further facilitates compliance with requirements of applicable measurement guidance documents, bringing the standardized requirements for calibration together under a single umbrella which allows end users to effortlessly meet those standardized requirements for calibration.

BRIEF DESCRIPTION OF THE SEVERAL VIEWS OF THE DRAWINGS

FIGS. 1A, 1B, and 1C are diagrams illustrating examples of calibration data sheets.

FIG. 3 is a diagram illustrating a dynamically-generated calibration data sheet similar to the calibration data sheet shown in FIG. 1C.

FIGS. 6A and 6B are diagrams illustrating another example of a calibration data sheet for a mass accuracy test, dynamically generated by a universal calibration process as described herein.

FIGS. 7A and 7B are diagrams illustrating another example of a calibration data sheet for a repeatability test, dynamically generated by a universal calibration process as described herein.

FIGS. 9A and 9B are diagrams illustrating an example of a calibration data sheet for calibrating the pressure transducer shown in FIG. 8, dynamically generated by a universal calibration process as described herein.

FIGS. 10A and 10B are diagrams illustrating an example of a calibration data sheet for calibrating a pipette, dynamically generated by a universal calibration process as described herein.

DETAILED DESCRIPTION

Figure 2:
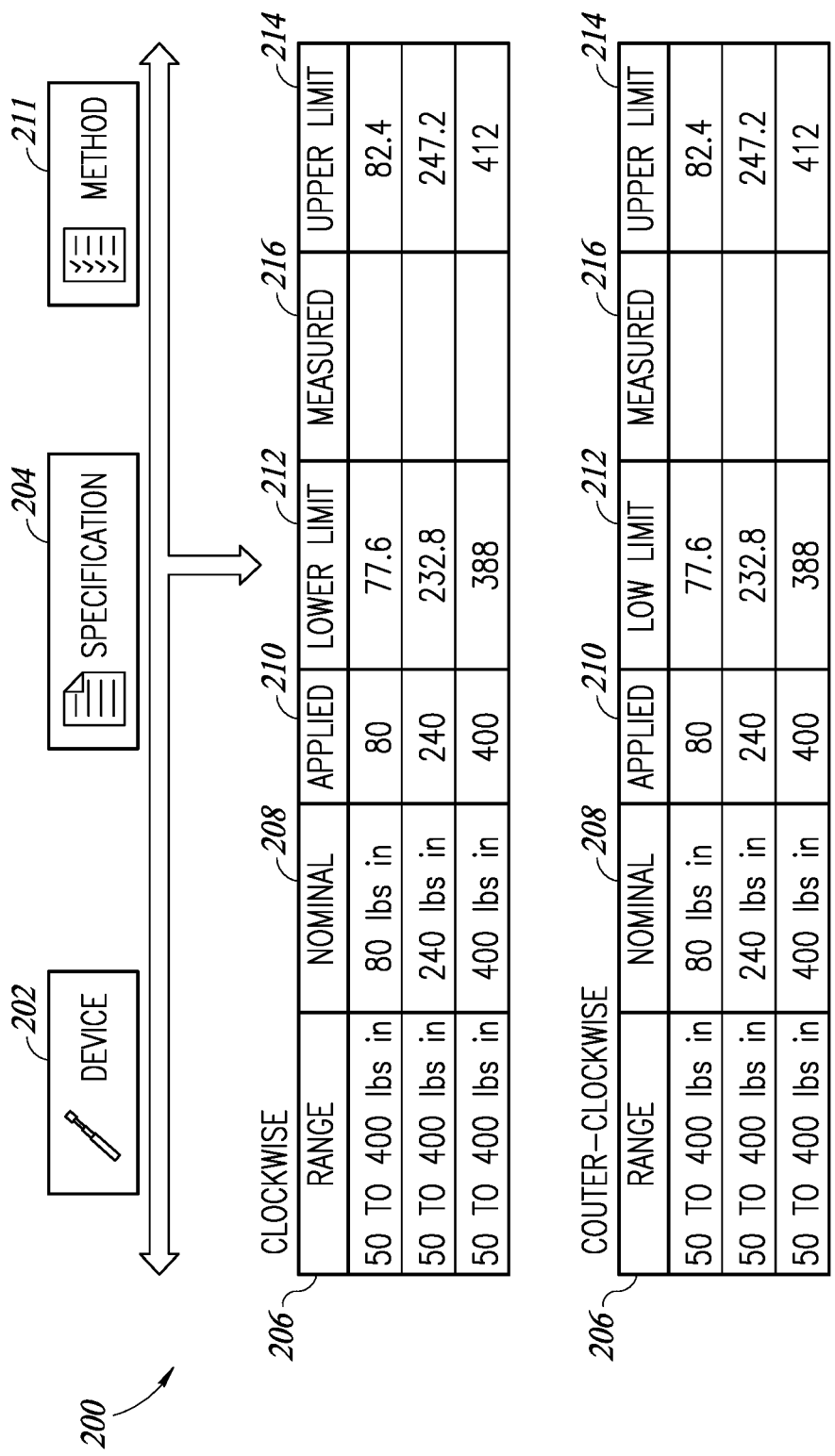
FIG. 2 is a diagram illustrating an example of a calibration data sheet that is dynamically generated using a universal calibration process as described herein.

Calibration software has largely been developed with a measurement comparison method at the forefront. This allows for direct comparison of measurement values, or "measured indications," produced by the measurement device under test with expected measurement values. However, the simplicity of the direct comparison approach disguises the need for a more formal approach to the calibration process, and often excludes other aspects such as application of corrections, conversions, and/or more complex formulae to the measurement values being evaluated.

While the direct comparison approach may be adequate for many routine calibration processes that are relatively simple, the inventors of the present disclosure have found that this approach is insufficient for more complex calibrations and often leads to the creation of special tests, add-ons, and/or various types of workarounds to existing routine calibration processes that are neither ideal nor sustainable over the long term. In some cases, these inadequacies promote the development of completely new and separate "purpose built" calibration software designed for particular devices to specifically address a single calibration discipline or measurement problem. With increasingly-complex systems having many types of devices and equipment requiring calibration, the process of managing the use, maintenance, and improvement of different device-specific calibration software, each built for specific types of devices or equipment, is increasingly difficult and problematic.

Calibration of a measurement device is usually performed using a calibration data sheet or "cal sheet" that directs a user in a measurement process and facilitates evaluation of measurement data produced by a device under test (DUT). Calibration data sheets typically come in different formats. For example, some calibration data sheets may be provided in a spreadsheet software (e.g., Excel) format, while others are provided in a word processing software (e.g., Word) format. Software applications with pre-programmed templates may be used to produce a desired calibration data sheet that allows for manual input of observed data. This observed data may be output by a DUT that is being calibrated utilizing a universal calibration process as disclosed herein.

The universal calibration process described herein may be utilized with a plurality of devices that are configured to measure different physical or electrical properties (i.e., heterogeneous measurement devices). Unlike conventional systems and methods that are device-aware or device-specific (i.e., they utilize discipline-specific calibration solutions that required identification of the discipline-specific device to be calibrated), the universal calibration process described herein is "device-agnostic" in that the same steps in the calibration process are taken, regardless of the particular device being calibrated.

Additionally, the universal calibration process may use different measurement comparison techniques. For example, the universal calibration process described herein may use a direct measurement comparison, an indirect measurement comparison, a ratio measurement comparison, a differential measurement comparison, a transfer measurement comparison, a substitution measurement comparison, or any other type of measurement comparison technique suitable to be utilized in the universal calibration process as described herein.

A direct measurement comparison is a comparison between a measurement value measured by a DUT and a known reference value, for example, a measured weight value output by a precision balance is compared directly to a known weight value, which may have been pre-selected for calibrating the precision balance. In other words, the direct comparison measurement is a comparison between two quantities that may be directly compared to each other (e.g., weight compared to a weight, a distance compared to a distance, a pressure compared to a pressure, a torque compared to a torque, a voltage compared to a voltage, etc.)

An indirect measurement comparison is a comparison between a measurement value measured by a DUT and a known reference value that may not be directly compared (e.g., a weight compared to a voltage, a distance compared to a period of time, a torque to a pressure, etc.) without additional processing of the measurement output by the DUT. For example, the indirect comparison process may include measuring a distance traveled by an object utilizing a distance measurement device over a selected period of time, measuring a speed of the object utilizing a speed measurement device, and converting the distance over the selected period of time to a speed measurement to be compared against a speed measurement measured by the speed measurement device.

A ratio measurement comparison is a comparison of a known quantity and an unknown quantity by multiplying a reference value by the ratio of the known quantity and unknown quantity. For example, a ratio of two resistors (one of known value and one of unknown value) can be multiplied by a reference resistor value to determine the unknown resistor value.

A differential measurement comparison is a comparison of a known quantity and an unknown quantity, utilizing a zero or null technique to determine the difference or deviation from a reference value. For example, two different DC voltage devices sharing a common ground may be applied to a multimeter. If the output of the different DC voltage devices is equal, the value measured by the multimeter will be zero. A positive or negative deviation is added to the reference quantity value to determine the unknown quantity value.

A transfer measurement comparison is a comparison of two values by using an intermediate device to enhance accuracy of the measurement. For example, if a voltage source is measured by a reference meter, the value and accuracy obtained by the reference meter is transferred to the voltage source and used for comparison with the unknown quantity value.

A substitution measurement comparison is a comparison of many step functions with a limited number of reference device quantities by substituting materials in between established steps. For example, a weighing scale with a capacity of 500 pounds may be calibrated by a single 100 pound weight by placing the 100 pound weight and recording the indication of the weighing scale, followed by substituting the indicated weight with any available object or objects to achieve the same indication and adding the calibrated 100 pound weight again to achieve a nominal applied weight of 200 pounds. This process can be repeated until the full capacity applied weight of 500 pounds is achieved.

While the above list of comparison techniques are some of the types of measurement comparisons that may be utilized by the universal calibration process, other suitable types of measurement comparisons may be utilized by the universal calibration process depending on a type of DUT being calibrated.

FIG. 1A is a diagram illustrating one example of a calibration data sheet 100, in this instance for a 300 psig (pounds per square inch, gauge) pressure gauge 102. The calibration data sheet 100 identifies the pressure gauge 102 as having a pressure range of 300 psig in the "Range" column 103 and indicates nominal pressure values within a "Nominal" column 104 to be input (e.g., applied) to the pressure gauge 102 for a calibration test, e.g., 60.0 psig, 120.0 psig, 180.0 psig, etc., as prescribed by the calibration data sheet 100. The calibration data sheet 100 in FIG. 1A further indicates an acceptable pressure measurement range having lower limit values in a "Lower Limit" column 106 and upper limit values in an "Upper Limit" column 108 of the calibration data sheet 100. The lower limit values and the upper limit values may be selected based on the corresponding nominal value within the "Nominal" column 104. The upper limit values and the lower limit values correspond to one of the nominal pressure values. The corresponding upper limit values, lower limits values, and the nominal pressure values are provided in the same row of the calibration data sheet 100 as shown in FIG. 1A. The lower limits and the upper limits are for evaluating pressure measurements output by the pressure gauge 102 as recorded within a "Measured" column 110 of the calibration data sheet 100. The pressure measurements output by the pressure gauge 102 are compared to the lower and upper limit values in the "Lower Limit" and "Upper Limit" columns 106, 108, respectively. When the actual pressure measurements output by the pressure gauge 102 fall within this selected range of the corresponding upper and lower limit values, a "pass" result is automatically produced and displayed in a "Result" column 112 of the calibration data sheet 100. Depending on the measurement system, the actual pressure measurements in the "Measured" column 110 are automatically, semi-automatically, or manually input into the "Measured" column 110 of the calibration data sheet 100.

FIG. 1B is a diagram illustrating another example of a calibration data sheet 114, in this instance for a 250 lbf-ft (pound-foot) torque wrench 116. The calibration data sheet 114 identifies the torque wrench 116 as having a torque range of 250 lbf-ft in the "Range" column 118 and indicates nominal torque values (i.e., known values) in a "Nominal" column 120 that are to be input (e.g., applied) to the torque wrench 116 for a calibration test, e.g., a first test 122 in which a 50 lbf-ft torque is input, a second test 124 in which a 150 lbf-ft torque is input, and a third test 126 in which a 250 lbf-ft torque is input. The calibration data sheet 114 further indicates a torque range having lower limit values in a "Lower Limit" column 128 and upper limit values in an "Upper Limit" column 130. The lower and upper limits values are utilized for evaluating the torque measurements that are output by the torque wrench 116. In this case, the calibration data sheet 114 indicates that the nominal torque value for each test, respectively, is to be input to the torque wrench 116 three times, producing three separate readings that are recorded in the "Reading 1" column 131, "Reading 2" column 132, and "Reading 3" column 134. An average of the three readings for each test is calculated and recorded in the "Average" column 136. The three nominal torque values are input or applied to the torque wrench 116 in both a clockwise direction and a counter-clockwise direction. When the average output torque measurement for each test is within the prescribed range set by the lower and upper limit values, a checkmark 138 (calibration indicator) is produced to indicate a passing result such that end users are informed that the torque wrench 116 is calibrated and within selected tolerances based on the comparison of the average measurement result with the lower and upper limit values, respectively.

FIG. 1C is a diagram illustrating yet another example of a calibration data sheet 140, in this instance for a 100 g (gram) precision balance 142. The calibration data sheet 140 identifies the precision balance 142 as having a 0-100 g range for a mass accuracy test 144 in the "Range" column 146, and a similar range for testing measurements in a repeatability test 148 and in an off-center shift test 150. For the mass accuracy test 144, the precision balance 142 is tested using masses having known cardinal point weights of 10 g, 25 g, 50 g, 75 g, and 95 g, which are noted in a "Cardinal Point" column 152 and an "Applied" column 154. Similar to the calibration data sheets 100, 114 in FIGS. 1A and 1B, the calibration data sheet 140 in FIG. 1C indicates a weight range having lower limit values within a "Lower Limit" column 156 and upper limit values in an "Upper Limit" column 158. These lower and upper limit values are utilized for evaluating the weight measurements that are output by the precision balance 142. Depending on the measurement system, the actual weight measurements are automatically, semi-automatically, or manually recorded in the "Measured" column 160.

Following the section for the mass accuracy test 144, the calibration data sheet 140 further includes sections for a repeatability test 148 and an off-center shift test 150 of weight measurements performed by the precision balance 142. For testing repeatability in the repeatability test 148 in this instance, the calibration data sheet 140 indicates that precision balance 142 is tested using a mass having a weight of 50 g for ten separate measurements, and the resulting weight measurements output by the precision balance 142 are recorded in the "Measured" column 160 of the repeatability section of the calibration data sheet 140. However, rather than comparing the resulting weight measurements to an acceptable weight range as is done in the mass accuracy test 144, the repeatability test 148 uses a more-complex formula 162 to produce a measure of standard deviation. The formula 162 may be provided at the bottom of the "Applied" column 154, for example, and an upper limit 164 of the standard deviation may be readily seen at the lower right-hand corner of the repeatability test 148 section of the calibration data sheet 140. A calculated result 166 is calculated utilizing the formula 162, and, after calculation, the calculated result 166 is input into a data field 168 below the resulting weight measurements in the "Measured" column 160 of the repeatability test 148 section. The calculated result 166 is compared to the upper limit 164 to determine whether the precision balance 142 is producing repeatable weight measurements within an acceptable standard deviation limit. For example, the precision balance 142 may pass the repeatability test 148 when the calculated result 166 from the formula 162 is less than the upper limit 164, which in this instance is equal to or less than 0.1 g.

Lastly, in FIG. 1C, the section of the calibration data sheet 140 for the off-center shift test 150 directs the user to apply a 50 g mass at different positions (e.g., center, top left, top right, bottom left and bottom right) on the precision balance 142 to produce five measurements output by the precision balance 142. These five measurements are displayed in the "Measured" column 160 of the off-center shift test 150 section of the calibration data sheet 140. These five measurements are used to calculate respective error values that are recorded in data fields of the "Error" column 170. Each one of the data fields corresponds to a respective one of the five error measurements. A maximum error value is identified and recorded in a "Max Error" data field 172 within the "Error" column 170, and the maximum error value in the "Max Error" data field 172 is compared to an upper maximum error limit 174 to assess the performance of the precision balance 142 with respect to weights being placed at different positions (e.g., center, top left, top right, bottom left and bottom right) on the precision balance 142. The maximum error value in the "Max Error" data field 172 may be seen at the bottom right-hand corner of the off-center section. The precision balance 142 may pass the off-center shift test 150 when the maximum error value is less than the upper maximum error limit 174, which in this instance is equal to or less than 0.1 g.

As illustrated, each of the calibration data sheets as shown in FIGS. 1A-1C, respectively, reflect different demands and requirements of different calibration tests, and these tests appear to depend uniquely on the particular type of device being tested (e.g., pressure gauge, torque wrench, precision balance) for calibration purposes and/or some other type of purpose. In other words, each of the calibration data sheets in FIGS. 1A-1C must be specifically refined and adapted for a type of DUT that is being calibrated. These differences in calibration tests based on the type of DUT generally result in creation of special tests, add-ons, and/or various types of workarounds to existing calibration processes that are neither ideal nor sustainable over the long term.

However, with the universal calibration process disclosed herein, it is recognized that different calibration tests for different devices configured to measure different physical or electrical properties (e.g., different types of DUTs, for example, those as previously discussed with respect to FIGS. 1A-1C and other types of DUTs discussed later herein as well as other types of DUTs that are not discussed herein) have aspects in common, and these commonalities can be utilized in a single approach to dynamically produce calibration data sheets for different devices (e.g., different types of DUTs). At a high level, the aspects in common include (1) identification of the DUT, (2) specification of proper performance of the DUT such as in a calibration specification, and (3) information, such as in a measurement model, indicating the measurement methodology to be used for evaluating performance of the DUT, for example, as indicated in FIG. 2. While these may be some of the commonalities, there may be other commonalities as well that may be leveraged in a device-agnostic evaluation process, according to the universal calibration process disclosed herein, such that the universal calibration process uniformly applies to any number of different types of DUTs to be calibrated.

FIG. 2 illustrates an example of a calibration data sheet 200 that is dynamically generated using at least one embodiment of the universal calibration system or process as described herein. The universal calibration process initially obtains information identifying a DUT 202 (e.g., identifying the discipline of the DUT, such as pressure, current, voltage, etc., or identifying a serial number, a part number, or some other type of identifying information), which in this example is a torque wrench. One type of identification includes the discipline, category, or type of the device, such as pressure, current, voltage, etc. Another type of identification includes unique information about the device, such as a serial number, a part number, etc.

Based on this identifying information, the calibration process accesses, obtains, or otherwise receives a calibration specification 204 of the DUT 202 that indicates expected operational performance of the identified DUT 202. The specification 204 may be received from an original equipment manufacturer (OEM), for example. The specification 204 may also include revisions, supplements, corrections, etc. to the OEM data in the specification 204 from the OEM. This updated information may be utilized to dynamically update or re-generate the calibration data sheet 200. These revisions, supplements, corrections, etc. to the OEM data may be dynamically transmitted to a processor such that the calibration data sheet 200 is dynamically updated and re-generated when the specification 204 is revised, supplemented, corrected, etc. to the OEM data such that the calibration data sheet 200 remains up to date.

To dynamically generate the calibration data sheet 200 shown in FIG. 2, the universal calibration process draws data from the calibration specification 204 for the identified DUT 202 and, in this example, automatically inserts an operational range of the DUT 202 (50 to 400 lbf-in). The operational range of the DUT 202, which in this case is the torque wrench, is shown in "range" columns 206 of the calibration data sheet 200. The specification data for the particular DUT 202 under test may further indicate that the DUT 202 has an acceptable output measurement tolerance of 3%, for example. An acceptable output measurement tolerance value constitutes a calibration threshold.

Other data that may be drawn from the calibration specification 204 includes nominal values for one or more parameters in the "nominal" columns 208 and applied values for one or more parameters in the "applied" columns 210. For example, a processor may receive the calibration specification 204 and draw the data from the specification 204 at which point the processor generates the calibration data sheet 200 including the "nominal" columns 208 and the "applied" columns 210 containing data drawn from the specification 204 as well as other various columns that will be discussed as follows. In some embodiments, only the nominal values in the "nominal" columns 208 may be readily drawn from the specification 204 directly, and the applied values in the "applied" columns 210 may be determined based on the nominal values and data drawn from the specification 204.

The calibration data sheet 200 further includes the "nominal" columns 208 that contain the nominal values, and the nominal values may be ideal, known values to be applied to the DUT 202 and measured by the DUT 202. The calibration data sheet 200 further includes the "applied" columns 210 that contain the applied values for corresponding parameters to be applied ("applied parameters"). The particular applied parameters may be dependent on the type of DUT. As non-limiting examples, torque may be an applied parameter for a torque wrench to be calibrated, and voltage may be an applied parameter for a DMM to be calibrated. The applied values may be actual values (e.g., 150 lbf-ft) of applied parameter (e.g., torque) that are applied to the DUT 202, e.g., by another measurement device or by a special purposes device, that are measured by the DUT 202. As noted earlier, in at least one embodiment, the output measurement tolerance (calibration threshold) may be 3% of the nominal values within the "nominal" columns 208 of the calibration data sheet 200. Thus, lower limit values and upper limits values may be determined by multiplying the corresponding nominal value by 3% and then subtracting and adding, respectively, a calculated value from this multiplication from and to the corresponding nominal value. These lower and upper limits values are positioned along the same row of the calibration data sheet 200 as the corresponding nominal value. The lower limit values may be displayed in "lower limit" columns 212, and the upper limit values may be displayed in "upper limit" columns 214. The lower limit values may be lower threshold values and the upper limit values may be upper threshold values. These lower and upper limit values, respectively, in the "lower limit" and "upper limit" columns 212, 214, respectively, may be calculated by the processor while generating the calibration data sheet 200 utilizing the nominal values received from the specification 204 and/or the applied values, which may have been received from the specification 204 or calculated from the nominal values.

Alternatively, the output measurement tolerance (calibration threshold) may be 3% of the applied values within the "applied" columns 210 of the calibration data sheet 200. For example, the lower limit values and the upper limit values may be determined by multiplying the corresponding applied value by 3% and then subtracting and adding, respectively, a calculated value from this multiplication from and to the corresponding applied value along the same row of the calibration data sheet 200.

A measurement methodology 211, which may be drawn from data provided by the OEM (e.g., in a measurement model), is used when calibrating the particular DUT 202, which in this case is the torque wrench. The measurement methodology 211 may be preprogrammed (e.g., according to an OEM performance verification manual, or according to an ASME (American Society of Mechanical Engineers) or ASTM (American Society for Testing and Materials) calibration standards, for example) and stored in a database readily accessible to a processor that performs the universal calibration process and generates the calibration data sheet 200. For the example shown in FIG. 2, the universal calibration process determines that the measurement methodology 211 for a calibration test of the identified DUT 202 includes test points of three different input torque values, which are the nominal values (e.g., 80 lbf-in, 240 lbf-in, and 400 lbf-in) within the "nominal" columns 208, that are measured in each of a clockwise direction and a counterclockwise direction. These input torque values may be referred to as nominal input torque values. In this instance, the measurement methodology 211 obtained by the universal calibration process specifies a nominal torque input of 80 lbf-in for the first test, 240 lbf-in for the second test, and 400 lbf-in for the third test in each direction (e.g., clockwise and counterclockwise). Given these nominal input torque values, the universal calibration process generates the calibration data sheet 200 showing the nominal input torque values as well as lower and upper limits values corresponding to each measured indication (measured value) to be recorded in the "measured" columns 216. As discussed earlier, the lower and upper limit values are calculated based on an output measurement tolerance (e.g., 3%) indicated in the calibration specification 204 of the DUT 202. Upon completion of generation of the calibration data sheet 200, the dynamically-generated calibration data sheet 200 shown in FIG. 2 is usable to conduct a calibration test of the DUT 202. When conducting the calibration, measured indications are obtained from the DUT 202 and are recorded in data fields of the "measured" columns 216 of the dynamically-generated calibration data sheet 200 (automatically, semi-automatically, or manually). The processor then compares a measured indication to the upper and lower limits within corresponding data fields of the upper and lower limit columns 214, 212, respectively, to evaluate the performance of the DUT 202.

For example, when the measured indication is between the corresponding upper and lower limits, the DUT 202 is determined to be calibrated. In some embodiments, the DUT 202 is determined to be calibrated for the measured indication when the measured indication is equal to the lower limit value or is equal to the upper limit value. In some embodiments, the DUT 202 is determined to not be calibrated for the measured indication when the measured indication is equal to the lower limit value or is equal to the upper limit value.

While FIG. 2 demonstrates the dynamic generation of the calibration data sheet 200 for a simple calibration process involving a single measured quantity by a single DUT 202, the universal calibration process may use the same principles of operation to dynamically generate calibration data sheets of much greater complexity for other, more complex calibration tests. For example, FIG. 3 illustrates a calibration data sheet 218 that appears similar to the calibration data sheet as shown in FIG. 1C. The calibration data sheet 218 is dynamically generated according to the universal calibration process of the present disclosure.

To generate the calibration data sheet 218 shown in FIG. 3, the universal calibration process first receives identification of a DUT 220, in this case a particular precision balance, and based on the identified DUT 220, the universal calibration process receives a specification with data indicating acceptable performance characteristics of the DUT 220. Identification of the DUT 220, which in this case is the particular precision balance, also enables the universal calibration process to receive information (e.g. from storage in a database) indicating a measurement methodology to be used for the calibration test(s) to be performed on the DUT 220 as discussed above with reference to the measurement methodology 211 shown in FIG. 2.

In the implementation illustrated in FIG. 3, the measurement methodology for the DUT 220 indicates that the calibration test should include a mass accuracy test 222, a repeatability test 224, and an off-center shift test 226. For each of these tests, the measurement methodology specifies test point weights (known weights), which are displayed in "applied" columns 234, to be applied to the DUT 220. A "cardinal point" column in the mass accuracy test 222 section of the calibration data sheet 218 may contain ideal values that correspond to the applied values within the "applied" column 234 for the mass accuracy test 222. Of additional significance, the measurement methodology specifies measurement data to be evaluated in each of the tests, which may be different for each test (e.g., the mass accuracy test 222, the repeatability test 224, and the off-center shift test 226). For example, in the mass accuracy test 222, the measurement data to be evaluated is a mean of the measurement value(s) produced by the DUT 220 at each test point weight in the "applied" columns. For calibration processes that require only a single measurement, e.g. as indicated in FIG. 3, the mean value is the same as the single measurement value produced in each test. For other calibration processes that perform multiple measurements at each test point weight, the mean value is an automatically calculated mean of all of the measurement values produced for the respective test weight.

The mean values are contained within data fields of "measured" columns 230 of the calibration data sheet 218. A range of the DUT 220 is contained in "range" columns 232 of the calibration data sheet 218. Applied values to be applied to the DUT 220 are contained within the "applied" columns 234 of the calibration data sheet 218. Lower limit values to be utilized in the mass accuracy test 222 are within a "lower limit" column 236, and upper limit values to be utilized in the mass accuracy test 222 are within an "upper limit" column 238.

While the mass accuracy test 222 section of the calibration data sheet 218 in FIG. 3 relies on mean values of the test weight measurements, the repeatability test 224 section of the calibration data sheet 218 relies on a calculation of standard deviation of the test weight measurements produced by the DUT 220 for each of the measured weights of the repeatability test 224 (in this case 10 tests with an applied 50.000 g weight). The measurement methodology for the DUT 220 in the repeatability test 224 further specifies a mathematical formula 240 (e.g., calculates a measurement of variability $S_x$ utilizing the applied values $X_1$ in the "applied" column 234 and the mean values $\overline{X}$ in the "measured" column 230 within the repeatability test 224 section of the calibration data sheet 218) to be used for producing the measurement of variability $S_x$ for evaluation, as indicated. The variability measurement data calculated by this mathematical formula 240 is evaluated with regard to a specified upper limit 241 as shown. The measurement of variability $S_x$ may be an average standard deviation calculated utilizing the applied values $X_i$ and the mean values $\overline{X}$ within the repeatability test 224 section of the calibration data sheet 218.

Lastly, the off-center shift test 226 section of the calibration data sheet 218 in FIG. 3 relies on a determined maximum error value, which again is different from the mean value used in the mass accuracy test 222 or the variability value Sx calculated for the repeatability test 224. For the off-center shift test 226, the measurement methodology received by the universal calibration process indicates locations for placement 242 of a measurement weight as well as an amount of applied weight as shown in the "applied" column 234 in the off-center shift test 226 section of the calibration data sheet 218. Data fields of the "measured" column 230 of the off-center shift test 226 section of the calibration data sheet 218 provides for recording of the measured weights, and data fields in an "error" column 244 of the off-center shift test 226 section provides recording of calculated error values utilizing the measured weights. A maximum error value is calculated, and the calculated maximum error value is evaluated with regard to a specified upper limit 245 as shown in the off-center shift test 226 section of the calibration data sheet 218. In this embodiment, the specified upper limit 241 is equal to or less than 0.1 grams (g).

Figure 4A:
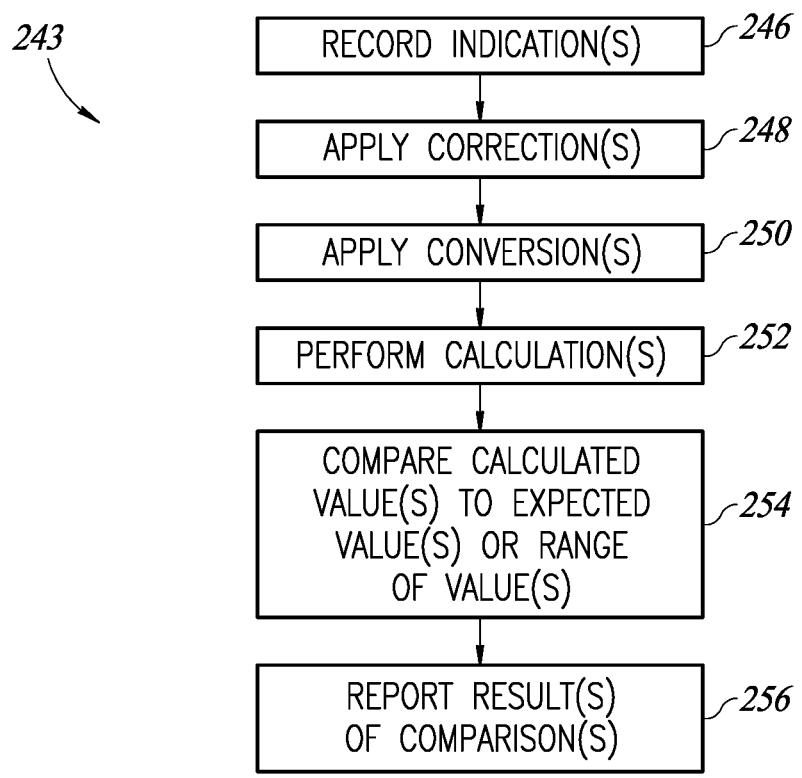
FIG. 4A is a flow diagram illustrating a universal calibration process of the present disclosure directed to core fundamental aspects that calibration processes have in common.

As illustrated in FIG. 4A, a universal calibration process 243 of the present disclosure moves calibration away from a perception that calibration of different devices (e.g., different types of DUTs) requires different and unique processes, e.g., that calibrating temperature measurement devices is different from calibrating pressure measurement devices, and calibrating pressure measurement devices is different from calibrating electrical measurement devices, and so on. Instead, the universal calibration process 243 as shown in FIG. 4A focuses on the core fundamental aspects that all of the calibration processes have in common (e.g., commonalities). The result is a recognition that every calibration process includes six common steps: (1) recording original observations or measurements 246 (i.e., recording measured "indications") that are produced by the DUT; (2) applying corrections 248 (e.g., correction factors, correction coefficients, correction values, etc.) to the original observations or measurements (e.g., recorded "indications") to produce corrected indications; (3) applying conversions 250 (e.g., conversion factors, conversion coefficients, conversion values, etc.) to the corrected indications; (4) performing measurement calculations 252 in accordance with measurement functions specified by the measurement methodology for the DUT; (5) comparing the calculated measurement values to an expected value or range of values 254 (e.g., upper and/or lower limits); and (6) reporting the result of the comparison 256 (e.g., calibrated, out of tolerance).

Figure 4B:
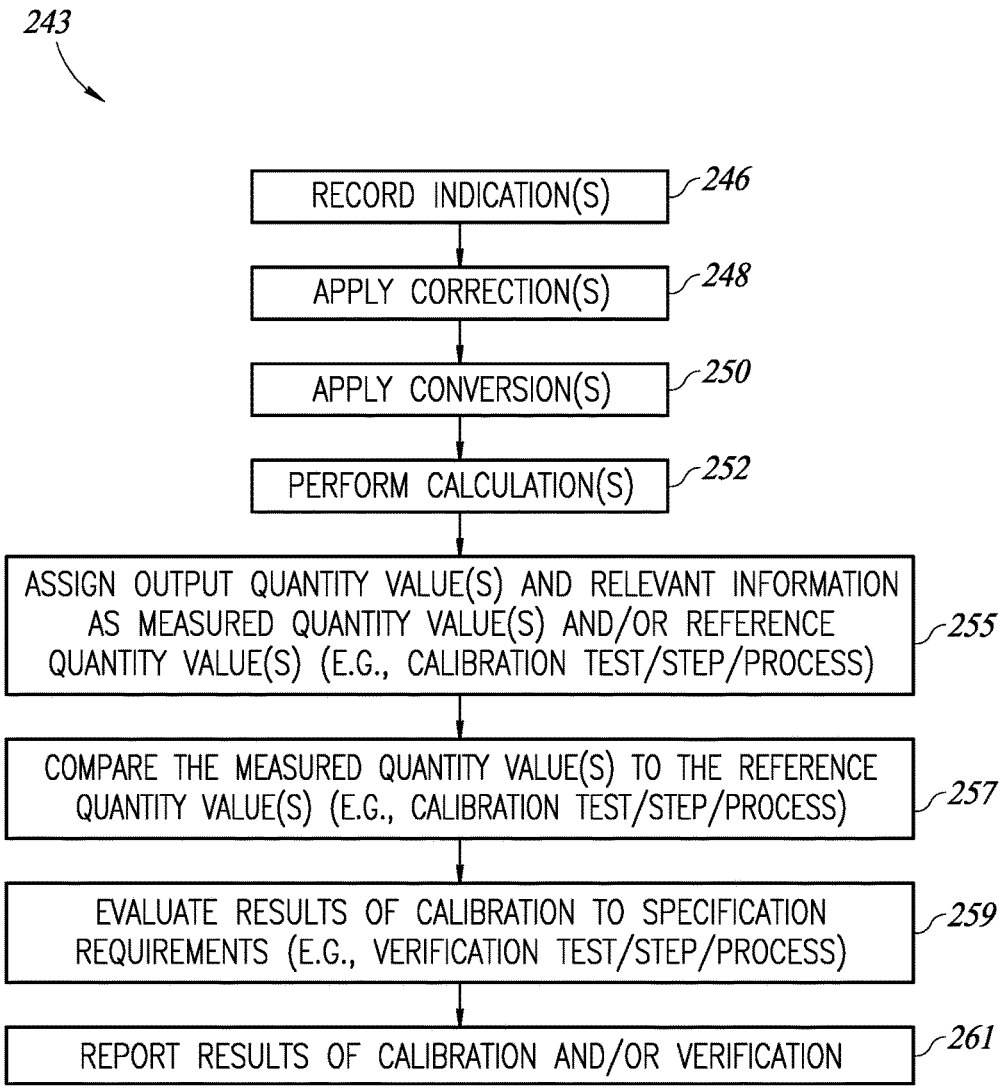
FIG. 4B is a flow diagram illustrating an example of a universal calibration process of the present disclosure.

Further illustrated as shown in FIG. 4B, a calibration performed according the universal calibration process 243 may be divided into eight functional steps as follows, which are described further below:

1. Record indications in step 246 that are provided by a measuring system (DUT), using the measuring instruments, measurement standards, reference materials, material measures, and reference data specified for the calibration.

2. Apply a correction in step 248 to recorded indications which have a corresponding correction factor or known systematic measurement error or measurement bias, thereby producing corrected indications.

3. Apply conversion values in step 250 to the corrected indications as necessary to convert the corrected indications into an appropriate unit of measurement (converted indication).

4. Utilizing the corrected and converted indications as input quantities, calculate output quantities in accordance with one or more specified measurement functions in step 252.

5. Assign the applicable output quantity values and relevant information as measured quantity values and/or reference quantity values in step 255, which may be a sub-step of step 252 as shown in FIG. 4A.

6. Compare the measured quantity values to the reference quantity values (calibration) in step 257, which may be a sub-step of step 254 as shown in FIG. 4A.

7. Evaluate the results of the calibration to specified requirements (verification) in step 259, which may be a sub-step of step 254 as shown in FIG. 4A.

8. Report the calibration/verification results in step 261, which may be the same or similar to the step 256 as shown in FIG. 4A.

Record Indications

Measured indications are the raw data values, or the "original observations," produced by a DUT during a calibration process. The DUT is part of a measuring system including the measurement standards, reference materials, material measures, reference data, and ancillary equipment required to perform the calibration process, as well as those items that may influence the assessment of measurement uncertainty. Indications are typically provided by a display (analog or digital) or a readout device coupled to the DUT. However, indications may also be provided by digital communication such as RS232 (Recommended Standard 232) or GPIB (General Purpose Interface Bus), analog outputs, calibration certificates, certified values, or reference data such as CODATA values, geological surveys, environmental monitoring, or nominal quantity values, e.g., as labeled on devices.

Figure 5:
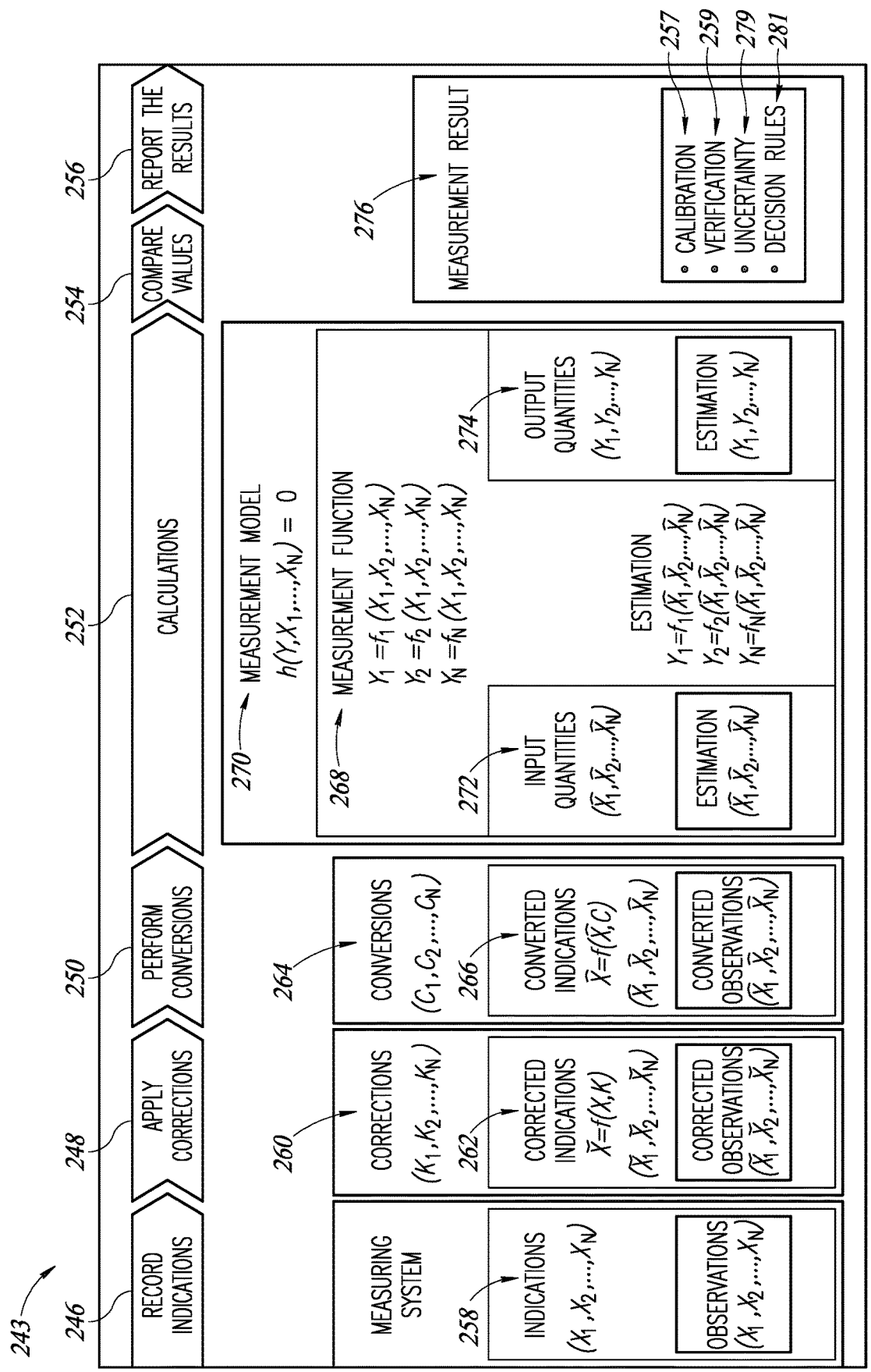
FIG. 5 is a graphic illustrating a framework for a universal calibration process as described herein.

In the graphic shown in FIG. 5, each indication 258 is represented by a symbol $X_i$ (i=1 to n). If the measurement methodology requires recordation of multiple samples for a measurement, each individual sample or indication of N number samples may be assigned an index value k (i.e., the $k^{th}$ sample of $X_i$). For example, the $4^{th}$ indication 258 of $X_2$ may be referred to as $X_{2,4}$.

Apply Corrections

Each indication 258 may have a corresponding correction 260 (e.g., factor, coefficient, value, etc.). The correction 260 may be selected or determined by a known systematic measurement error or measurement bias that can be minimized by applying the correction 260 to the corresponding indication 258. In the universal calibration process 243 described herein, every indication 258 has a corresponding correction 260 applied, even when a correction 260 is not explicitly stated. Under the universal calibration process 243, the default correction 260 is a correction factor of 1. In other words, without a specified correction, when applying a correction factor of 1, the "corrected" indication 262 is the same as the raw indication 258. Always applying the correction 260 to the corresponding indication 258 allows for a uniform calibration process that does not change based on a specific measurement methodology or calibration discipline for a particular type of DUT to be calibrated or tested utilizing the universal calibration process 243. This also ensures that each step of the universal calibration process 243 is completed when preparing for and conducting a calibration of a particular type of DUT.

In the graphic of FIG. 5, each of the corrections 260 is represented by a symbol $K_i$ which corresponds to each one of the indications 258 for which each one of the corrections 260 applies. When multiple corrections 260 are applied to the same indication 258, the multiple corrections 260 may be designated by the indication 258 index i and a letter. For example, an index i representing at least one of the indications 258 to which with three corrections 260 are to be applied, the corrections may be in the form of $K_{i,a}$, $K_{i,b}$, $K_{i,c}$.

Corrected indications 262 may be represented by a check notation $\check{X}_i$ in order to differentiate corrected indications 262 from the raw indications 258 represented by values $X_i$. The corrections 260 may be applied using any mathematical technique, for example:

By multiplication, e.g., using a correction value as shown in Equation (1):

$$\check{X}_i=(X_i \cdot K_i) \tag{1}$$

By subtraction, e.g., for removing an error or bias, as shown in Equation (2):

$$\check{X}_i=(X_i - K_i) \tag{2}$$

By addition, e.g., by adding a correction or offset value as shown in Equation (3):

$$\check{X}_i=(X_i + K_i) \tag{3}$$

By division, e.g., by using a quotient as shown in Equation (4):

$$\check{X}_i=(X_i / K_i) \tag{4}$$

Or by using a specific formula, which may be simple or complex, e.g., as used when applying a temperature coefficient of a resistor as shown in Equation (5).

$$\check{X}_i=R_{23}[1+K_{i,a}(T-23)+K_{i,b}(T-23)^2] \tag{5}$$

Perform Conversions

Recognizing that the corrected indications 262 may be recorded in a different unit of measure than the unit of measure for the desired evaluation quantity, a conversion 264 (e.g., $C_1, C_2, \ldots, C_n$), which may be a conversion factor, coefficient, value, etc., may be applied to a corresponding one of the corrected indications 262 ($\check{X}_i$), respectively. For example, if the calibration specified for a DUT is indicated in millimeters, and a gauge block that measures in inches is utilized to calibrate the DUT, the universal calibration process 243 applies an appropriate conversion 264 (e.g., factor, coefficient, value) to the corresponding corrected indication 262 (which are in units of inches (in) based on the measurement provided by the gauge block) so that the corresponding corrected indication 262 is converted into a converted indication having the desired unit of measurement (which in this instance is millimeters (mm)) for an evaluation or determination of calibration. This also enables the uncertainty of measurement to be calculated in the proper unit of measure.

In the universal calibration process 243 described herein, every corrected indication 262 has a conversion 264 applied to the corrected indication 262, even when the conversion 264 of measurement unit is not explicitly stated. In the absence of a stated conversion, the universal calibration process 243 described herein may employ a default conversion factor of 1. In other words, without a specified conversion, applying a conversion factor of 1 to the corrected indication 262 causes a "converted" indication 266 to be the same as the corrected indication 262. As with the universal application of corrections 260, enforcing application of the conversions 264 in all cases ensures a uniform process that does not omit any step within the universal calibration process 243 and does not change the calibration process based on specific device characteristics, measurement methodology, or calibration discipline based on a particular type of a DUT. In other words, steps performed in the universal calibration process 243 to calibrate a first type of DUT remain the same when calibrating a second type of DUT different from the first type of DUT.

In the graphic as shown in FIG. 5, each conversion 264 is represented by a symbol $C_i$ which corresponds to the corrected indication 262 to which the respective conversion 264 is to be applied. Converted indications 266 may utilize a hat notation $\hat{X}_i$ in order to differentiate converted indications 266 from the raw indications 258 ($X_i$) and the corrected indications 262 ($\check{X}_i$). Each individual converted indication 266 for N number of samples of xi may be assigned an index value k (the $k^{th}$ sample of ($\hat{X}_i$). For example, the converted indication 266 for the $4^{th}$ observation of $X_2$ may be referred to as ($\hat{X}_{2,4}$).

Conversions may be performed using any mathematical technique, for example:

By multiplication (or similarly division), through use of a conversion factor as shown in Equation (6):

$$\hat{X}_i=(\check{X}_i \cdot C_i) \tag{6}$$

By addition, as shown in Equation (7):

$$\hat{X}_i=(\check{X}_i + C_i) \tag{7}$$

By subtraction, as shown in Equation (8):

$$\hat{X}_i=((\check{X}_i - C_i) \tag{8}$$

Or by using a specific formula, which may be simple or complex, e.g., as used when converting a temperature measurement from ° F. to ° C. as shown in Equation (9):

$$\hat{X}_i=(\check{X}_i - 32) \cdot 5/9 \tag{9}$$

The converted indications 266 are then used as the quantities that are input to the measurement function(s) 268 specified by a measurement model 270 for the DUT.

Calculations

The measurement model 270 indicated in FIG. 5 is a mathematical construct that describes the relationship of the values involved in a calibration assessment of the DUT. These values include input quantities 272, measurement functions 268, and output quantities 274. One or more measurement functions 268 may be applied to the input quantities 272, allowing for multiple output quantities 274 to facilitate different calibration tests using a single set of recorded indications 258.

The input quantities 272 in this aspect of FIG. 5 are measurement data that are passed into the defined measurement function 268. In the universal calibration process 243 described herein, the input quantities 272 are the converted indications 264 produced by the conversion step 250 described above.

The measurement function 268 is a formula or set of formulas that transforms the input quantities 272 into output quantities 274. Performing the corrections and conversions 260, 264 to the recorded indications 258 in previous steps may simplify the measurement function 268. In many cases, the measurement function 268 may involve the calculation of statistical values such as average, minimum, maximum, standard deviation, and variance, to be used when evaluating the measurement performance of the DUT.

As a default, the universal calibration process 243 described herein may generate a calibration data sheet that is programmed to calculate the mean or average of the input quantities 272 (e.g., a default measurement function of $Y=f(X)=\overline{X}$), which can be used for every instance of a calibration test, regardless of the number of samples or raw indications 258 when performing the particular calibration test for a particular type of DUT. Of course, depending on the nature of the calibration test being performed (e.g., a repeatability test 224 or an off-center shift test 226 as described with regard to FIG. 3), the universal calibration process 243 may generate a calibration data sheet programmed to perform other mathematical operations (e.g., calculation of standard deviation) that produce the output quantities 274 needed for evaluation of the DUT. For example, multiples types of calculations may be performed on the converted indications 266 such that multiple types of calibration tests may be carried out on the DUT (e.g., the mass accuracy test 222, the repeatability test 224, and the off-center shift test 226 as shown in FIG. 3).

Compare Values and Report the Result

The output quantities 274 (i.e., the results of the applied measurement function) are the measurement data used in the subsequent steps of comparing values 254 and reporting the result 256. Details of the specific evaluation steps that may be employed in these latter steps of the universal calibration process are well documented elsewhere and understood by persons of ordinary skill, and thus are not explicitly described herein. The process of comparing values 254 and reporting results 256 may also include specific steps for evaluating uncertainty 279 in the measurement process, as well as the application of decision rules 281 when evaluating the acceptability of the output quantities 274, e.g., according to calibration standards for a type of DUT.

As noted, the output quantities 274 from the measurement function(s) 268 are used to perform the calibration of the DUT (i.e., the comparison 254 of the output quantity 274 to a reference quantity value(s) which may have been preselected based on data in a specification of the DUT). For example, the reference quantity value(s) may include an upper limit values and a lower limit values as shown in FIG. 3. In some implementations, the universal calibration process 243 described herein may, by default, use calculated mean or average values for comparison 254 with a reference value. In other implementations, other ones of the output quantities 274 can be used to provide the evaluation data that are used in the calibration process, such as a min, max, mode, standard deviation, coefficient of variation, etc. Reporting results 256 may include a measurement result 276 that may include summary statistics, in some cases a common set of statistics, which allows any of the calculated evaluation data to be used in the calibration of the DUT. The universal calibration process 243 allows for multiple comparisons and evaluations to be performed from a single set of recorded indications 258 (e.g., raw indications).

The verification process 259 may be used to evaluate the results of the calibration test 257. In some implementations, the verification step 259 may check to see if one of the output quantities 274 is within a maximum permissible measurement range (e.g., upper and lower limit values as shown in FIG. 3), generally determined by a specification or tolerance (calibration threshold) defined for the DUT, for example, within a specification provided by an OEM. Verification may also include evaluating a calculated measure of uncertainty, which may be one of the output quantities 274, to a target measurement uncertainty, a minimum test uncertainty ratio, or other criteria, which may be one of the reference quantities, defined by a particular method, customer, or laboratory policy that applies to the calibration being performed.

When reporting the result 256 of the calibration, the measurement result 276 typically includes all relevant information for the given measured of the calibration test. Generally, the reporting the result 256 step includes the output quantities 274 along with the nominal or expected values, the limits of error, and the uncertainty of measurement.

Additional information may be calculated and reported, such as a test uncertainty ratio, test accuracy ratio, probability of false acceptance, and guard-band limits where applicable.

FIGS. 6A and 6B illustrates another example of a calibration data sheet 278 that is dynamically generated by the universal calibration process 243 described herein for a DUT 280, which in this instance is a precision balance with which a 50 g calibration test is performed. The calibration test performed in FIGS. 6A and 6B may be simple, but the amount of detail shown confirms the robust nature of the universal calibration process 243 which comes to bear in more complex calibration scenarios such as shown in FIGS. 7-10, which are generally more complicated than the relatively simple calibration test performed in FIGS. 6A and 6B.

Having identified a particular precision balance as the DUT 280, the universal calibration process 243 dynamically generates the calibration data sheet 278 as shown in FIGS. 6A and 6B using specification data and measurement methodology for the particular precision balance (DUT 280). In this example, the measurement methodology includes measurement of a 50 g (gram) mass standard by the DUT 280.

An "indications" field 282 of the calibration data sheet 278 shows two tests of the DUT 280, in this case the precision balance. The indications within the "indications" field 282 in this calibration data sheet 278 are 50.000 g ($x_1$) and 49.995 g for the observations $x_1$ and $x_2$, which have been observed by the DUT 280. The 50.000 g and 49.995 g values may be the same or similar to the raw indications 258 as discussed above with respect to FIG. 5. For each of the two tests, corrections 284 ($K_1$ and $K_2$) and conversions 286 ($C_1$ and $C_2$) are applied to the indications set forth in the "indications" field 282. The corrections 284 and the conversions 286 may be the same or similar to the corrections 262 and conversions 264 as discussed with respect to FIG. 5. The output quantities 288 are then determined and reported as shown utilizing the converted indications 50.000 and 49.995 for converted observations ($\tilde{x}_1$ and ($\tilde{x}_2$. The output quantities 288 may be the same or similar to the output quantities 274 as discussed earlier with respect to FIG. 5.

The output quantities 274 may correspond to measured indications displayed in "measured" columns 216, 230 297, 338 of calibration data sheets 200, 218, 278, 297, 320. In other words, the "measured" columns may contain ones of, averages of, or other like values determined from the output quantities 274 that are calculated or determined by a processor utilizing raw measurements measured by a DUT that is being calibrated.

On the right-hand side of the calibration data sheet 278, summary statistics 290 are provided for each of the indications (e.g., 50.000 g and 49.995 g), including the application of corrections and conversions 284, 286. The summary statistics 290 in this example include the mean, min, max, standard deviation, variance, span, mode, midrange, and coefficient of variation. Again, with a simple calibration as illustrated, the summary statistics 290 do not necessarily provide significant additional information, but the calibration data sheet in FIGS. 6A and 6B demonstrates that at each step of the calibration process, applicable statistics may be calculated in accordance with the prescribed measurement methodology. These summary statistics 290 are useful in step-by-step auditing and/or tracing of every measurement performed. This audit and/or tracing of every measurement performed may provide end users with the ability to determine whether the DUT is not calibrated, or whether another component being utilized to calibrate the DUT is not functioning as expected or desired, which may have resulted in a false indication that the DUT is not calibrated when instead the component not functioning as expected is resulting in the false reading. For example, the end user may be able to review the statistics that are provided step-by-step during the prescribed measurement methodology to determine that the DUT is being properly calibrated and is not being miscalibrated based on auditing and/or tracing these statistics.

Furthermore, under the universal calibration process 243 described herein, the measurement methodology is completely extensible and can be used to generate any desired statistics for the different devices being calibrated. The same statistics (i.e., a common set of statistics) may be generated for all devices to be calibrated, without regard to the particular device under test, in a device-agnostic evaluation process. For a device under test, the process may include evaluating one or more statistics of the common set of statistics for the DUT according to the respective calibration process for the DUT to determine a calibration state of the DUT, and outputting a calibration indication indicating a calibration state of the DUT. A measurement model for the DUT may include one or more measurement functions that are used (e.g., applied to an indication) to determine one or more statistics in the common set of statistics. When evaluating the one or more statistics of the common set of statistics, the one or more statistics may be compared to a calibration threshold for the DUT to determine the calibration state of the DUT.

In the example shown in FIGS. 6A and 6B, an overall summary is provided on the top line 292 (e.g., top row) of the calibration data sheet 278. Where the measured indication of 49.995 g is between a lower limit 294 and an upper limit 296 derived from the specification data for the precision balance (DUT 280), a checkmark 298 (calibration indicator) is shown on the right indicating an acceptable calibrated performance of the precision balance (DUT 280). Additional overall statistical measures may also be reported, such as a calculated amount of error 300, deviation 302, percent tolerance (calibration threshold) 304, percent guard band 306, etc. In this instance, the minimum indication (e.g., measured value) of 49.995 g is compared to the upper limit 50.010 g and lower limit of 49.990 g and since the minimum indication is between the upper limit and the lower limit, the precision balance is determined to be calibrated such that the checkmark 298 is output. The minimum indication may be compared to the upper limit and the lower limit by a processor, which also outputs the checkmark 298.

The checkmark 298, which is a calibration indicator, may be output when a measured indication 297, which is the indication 49.995 g, is between the lower limit 294 and the upper limit 296. While in this embodiment, the indication 49.995 g is between the upper and lower limits, the checkmark 298 may be also be output when the measured indication 297 is equal to the lower limit 294 or is equal to the upper limit 296. Alternatively, if the measured indication 297 is less than the lower limit 294 or greater than the upper limit 296, an "X," which may be encircled by a red circle for example, may be displayed to indicate that the DUT 280 is out of tolerance.

The top line 292 further includes a "nominal" column 291, an "applied" column 293, and an "expected" column 295. A nominal value in the "nominal" column 291 may be an ideal value representative of a weight to be applied to the DUT 280 and measured by the DUT 280. An applied value in the "applied" column 293 may be a mean or average value of multiple of applied parameters (e.g., a 50-g weight) having the applied value. The applied parameters have known values that are applied to the DUT 280, which may be readily seen in FIG. 6A. In some embodiments, the applied parameters may be an applied standard deviation of 0, which may readily be seen in FIG. 7A. An expected value in the "expected" column 295 may be the same or similar to the nominal value within the "nominal" column 291 but, unlike the nominal value, the expected value may have a selected number of decimals or significant figures (e.g., sig figs).

Figure 7A:
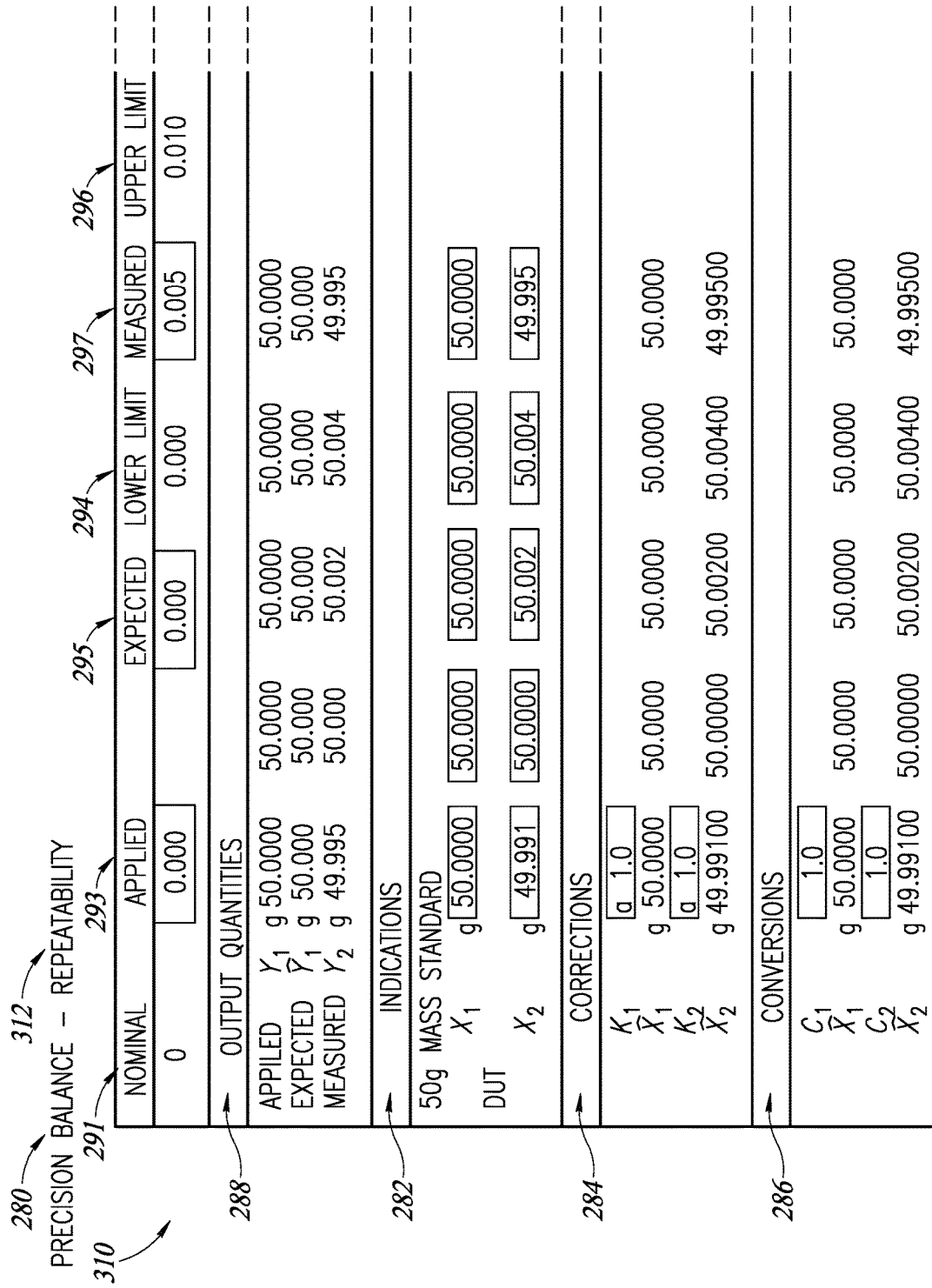

Turning to a calibration data sheet 310 shown in FIGS. 7A and 7B, a repeatability test 311 for the precision balance (DUT 280) is provided. In this case, the repeatability test 311 requires multiple measurements where a standard mass of 50 g is applied five times to the DUT 280 and five measurement readings or indications 282 for the DUT 280 are recorded. Again, in this calibration test, no substantive corrections or conversions are required so default values of 1.0 are used in the application of the corrections 284 and conversions 286. Ultimately, the output quantities are generated and reported similar to the example shown in FIGS. 6A and 6B.

At the top line 292 (e.g., top row) of the calibration data sheet 310, overall statistical measurements are calculated and reported. In the case of FIGS. 7A and 7B, the desired repeatability measurement is a standard deviation of the measurement data from the nominally applied standard mass. The desired deviation of 0.000 is shown as the applied value, and specification data for the DUT 280 indicates the lower limit 294 being equal to 0.000 and the upper limit 296 being equal to 0.010. The measured indication 297 is a measured standard deviation (e.g., here 0.005). Since the measured indication 297 is within the acceptable range, a checkmark 298 is produced on the right indicating an acceptable calibrated performance of the DUT 280. As can be seen, the universal calibration process 243 employed in generating the calibration data sheets 278, 310 in FIGS. 6 and 7 is the same. The difference is in the measurement methodologies that are received and applied as part of the calibration test, to produce the desired output quantities and summary statistics for evaluation to determine whether the DUT 280 is calibrated either for an accuracy test as shown in FIGS. 6A and 6B or a repeatability test 311 as shown in FIGS. 7A and 7B.

Figure 8:
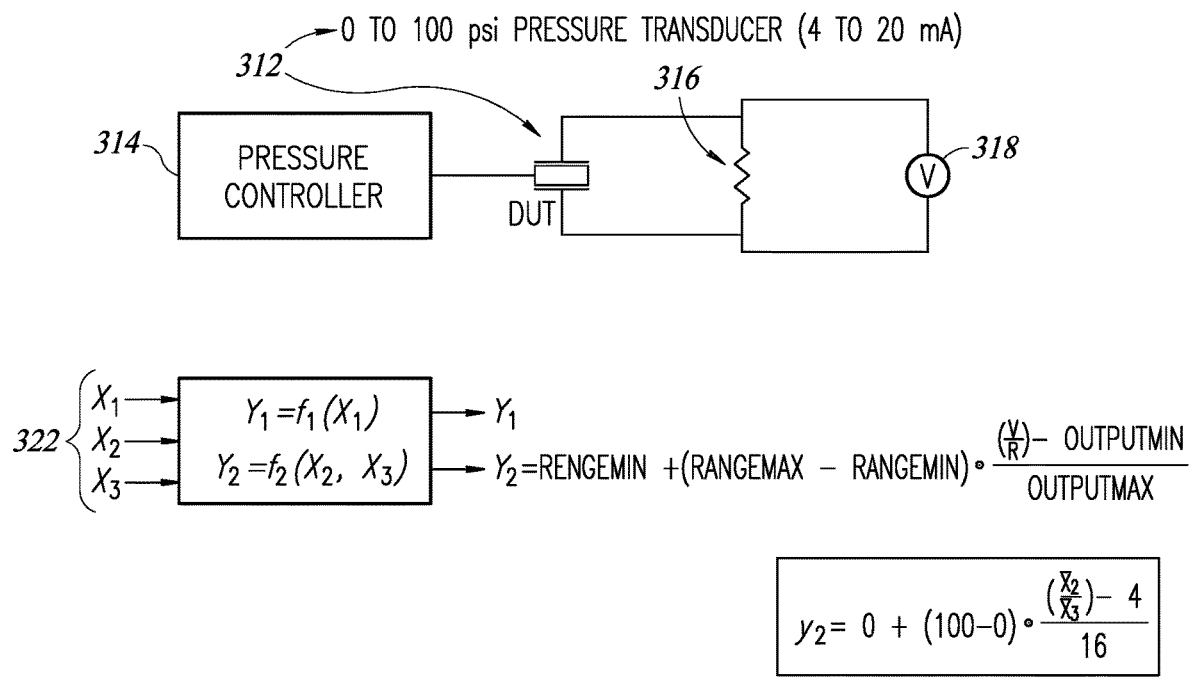
FIG. 8 is a schematic diagram of a pressure transducer and accompanying measurement processes.

FIGS. 8 and 9 illustrate another calibration scenario for another type of DUT 312, which in this instance is a pressure transducer. In this calibration scenario in which the DUT 312 is a pressure transducer, the measurement methodology requires multiple different input quantities in order to calculate output quantities that are to be evaluated to determine whether the DUT 312 is calibrated. In this example, the DUT 312 is a 0 to 100 psi (pound per square inch) pressure transducer that operates with an output range of 4 to 20 mA (milliamps) representing measured pressures. When implementing a calibration test, a pressure controller 314 applies a known pressure to the pressure transducer under test (DUT 312). This causes the DUT 312 to output a current across a 1 k-ohm (kilo-ohm) shunt resistor 316, and a voltage across the shunt resistor 316 is measured with a voltmeter 318. The measured voltage is indicative of the pressure applied to the DUT 312. The shunt resister 316 and the voltmeter 318, which are components coupled to the DUT 280, are utilized to monitor a characteristic of the DUT 280. In this instance, the characteristic is an electrical characteristic such as a voltage of the DUT 312 that the shunt resistor 316 and the voltmeter 318 are utilized to measure. In some embodiments, the voltmeter 318 may be a multi-meter as well that measures a current passing through the DUT 312. In other words, components may be coupled to the DUT 312 to monitor characteristics of the DUT 312 for purposes of carrying out the universal calibration process 243 of the present disclosure.

The universal calibration process 243 described herein receives a measurement methodology that produces a calibration data sheet 320 as shown in FIGS. 9A and 9B. The calibration data sheet 320 in FIGS. 9A and 9B requires recorded indications 282 for three input values, namely the pressure applied by pressure controller ($x_1$), the voltage measured by the voltmeter ($x_2$), and the resistance value of the shunt resistor ($x_3$). As indicated in the calibration data sheet 320, five pressure values are input by the pressure controller 314 resulting in five measured voltages across the shunt resistor 316. The resistance value of the shunt resistor 316 is static and, therefore, only needs to be recorded once in the calibration data sheet 320 and is then repeated for each measurement.

The calibration data sheet 320 in FIGS. 9A and 9B allows for three correction values 284 (a, b, c) to be applied to the pressure indications, with additional ones of the corrections 284 to be applied to the voltage indications (e.g., measurements) and the shunt resistance, as may be needed. In the example shown, the corrections 284 are 1.0, signifying no substantive corrections are made. Similarly, the conversions 286 that are applied have a value of 1.0, signifying no substantive conversions being made.

The measurement methodology employed with the calibration data sheet 320 shown in FIGS. 9A and 9B employees a mathematical formula 322 that operates on the indications (i.e., measured voltages) to produce measured indications in psi (pounds per square inch) unit of measurement. The overall summary statistics at the top line 292 of the calibration data sheet 320 use calculated mean values for each of the applied, expected, and measured output quantities. The applied values may be the actual values applied to the DUT 312, the expected values may be the expected value before being applied to the DUT 312, and the measured indications may be the measured indications that are output, measured, or determined by the DUT 312.

The "corrections" field 284 include three correction factors 285 that are applied to the raw measured indications measured by the DUT 312 a displayed in the "indications" field 282. The three correction factors 285 are all equal to 0 in this situation. In some embodiments, each of the three correction factors 285 may be different from each other.

In FIGS. 10A and 10B, an example calibration data sheet 324 is shown for another type of DUT 326, which in this instance is a 10 μL (microliter) pipette. The universal calibration process 243 described herein provides for recording indications in microliters (μL) and milligrams (mg), applying density corrections 284, and applying a conversion 286 from milligrams to microliters. Ultimately, the output quantities 288 are generated according to the received measurement methodology for the particular DUT 326 under test, and overall summary statistics are produced at the top line 292 (e.g., top row) of the calibration data sheet 324. In this instance, overall summary statistics are provided for two tests, a first test 328 and a second test 330. The first test 328, which is for measurement accuracy, reports statistics based on calculated mean values of the output quantities 288, and the second test 330, which is for measurement precision, reports statistics based on a calculated coefficient of variation of the output quantities 288. Again, the universal calibration process 243 described herein is able to operate using a single set of indications 282 observed from testing the identified pipette (DUT 326) to produce an output set of statistics for the multiple calibration tests 328, 330.

The calibration data sheet 324 further includes nominal values in a "nominal" column 331, applied values in an "applied" column 332, expected values in an "expected" column 334, lower limit values in a "lower limit" column 336, measure values in a "measured" column 338, and upper limit values in an "upper limit" column 340. As the details of these values have been previously described herein with respect to other ones of the calibration data sheets of the present disclosure, for the sake of simplicity and brevity of the present disclosure, the details of these values within the calibration data sheet 324 will not be discussed in further detail herein.

The first test 328 has a corresponding first lower limit value and first upper limit value that are in the "lower limit" column 336 and "upper limit" column 340, respectively. The corresponding first lower and first upper limit values, respectively, are compared to a corresponding measured indication along the same row and within the "measured" column 338. This comparison may be carried out by a processor.

The first lower and first upper limit values may be calculated by multiplying a value (e.g., percentage) by a corresponding expected value in the "expected" column 334 and subtracting/adding a calculated value from this multiplication from/to the corresponding expected value. This calculation may be performed by the processor such that the processor determines the first lower limit value and first upper limit value. This calculation of the first lower and first upper limit values may be determined based on data received by the processor from a specification for the DUT 280.

The second test 330 has a corresponding second lower limit value and second upper limit value that are in the "lower limit" column 336 and "upper limit" column 340, respectively. The corresponding second lower and second upper limit values, respectively, are compared to a corresponding measured indication along the same row and within the "measured" column 338. This comparison may be carried out by the processor.

The second lower and second upper limit values may be calculated by subtracting/adding a value from/to a corresponding expected value in the "expected column 334. This calculation may be performed by the processor such that the processor determines the second lower limit value and second upper limit value. This calculation of the second lower and second upper limit values may be determined based on the data received by the processor from the calibration specification for the DUT 280.

By separating device information, specification information, and measurement methodology, the universal calibration process described herein is able to dynamically create calibration data sheets for nearly unlimited different devices (e.g., unlimited types of DUTs) and calibration tests. Accordingly, the universal calibration process described herein provides a device-agnostic evaluation process that is able to evaluate outputs of different calibration processes for different devices without regard to identification of the devices. Every calibration evaluation can be performed by implementing the same steps. The calibration data sheet can be designed to report a common set of summary statistics, based on the desired measurement data, and in the process, a complete record of all observations, corrections, conversions, and calculations is retained. This facilitates a step-by-step audit and/or tracing of any calibration measurement being performed. Defining the measurement function(s) up front, and incorporating the measurement function(s) into the calibration data sheet facilitates a full and complete uncertainty analysis, and routine and complex calibrations alike can be performed in a familiar and nearly uniform manner such that end users may easily and quickly conduct simple or complex calibration tests for various types of simple and complex types of DUTs.

Systems and methods for implementing a universal calibration process 243 as described herein may include one or more computers (computing devices) with processing circuitry configured by either executable program instructions, e.g., stored in a non-transitory computer-readable medium, or specially configured circuitry, e.g., one or more application-specific integrated circuits, or any combination thereof, to perform some or all of the functions (logical operations, calculations, steps) described herein. For example, in at least one implementation, a method and system of the present disclosure may include receiving an identification of a device to be calibrated; based on the identification of the device, receiving specification data for the device that indicate characteristics of the device and/or operational parameters that indicate proper (e.g., calibrated) operation of the device; and further, based on the identification of the device, receiving calibration methodology indicating a desired calibration process and supporting data processing steps, mathematical formulas, functions, and the like, to obtain evaluation data. The evaluation data may be considered (e.g., compared) with one or more of the operational parameters that indicate proper (e.g., calibrated) operation of the device. The specification data and measurement methodology may be defined and correlated with identified devices, and stored in a computer-accessible database for later retrieval. With the device identification, specification data, and measurement methodology now obtainable or obtained, the systems and methods described herein may dynamically generate a calibration data sheet that includes the identification of the device under test, specified calibration inputs to be provided to the device, logical operations to receive measurement data from the device, calculate evaluation data based on specified functions or formulas, and compare the resultant evaluation data to reference data to determine a calibration outcome for reporting to a user.

In various embodiments, methods and systems for implementing a universal calibration process may be configured to provide a calibration process by (1) recording indications (original observations or measurements) produced by an identified measurement device and/or one or more ancillary devices (a non-limiting example being a thermometer that provides a temperature of the environment of the identified measurement device under test) in response to one or more calibration inputs to the device; (2) applying one or more corrections to the recorded indications, which corrections may have a default value of 1 if substantive corrections are not required or desired; (3) applying one or more conversions to the corrected indications to convert the indication data, e.g., to another unit of measure, which conversions may have a default value of 1 if substantive conversions are not required or desired; (4) performing measurement calculations on the corrected indications in accordance with measurement functions specified by a received measurement methodology for the device under test, to obtain evaluation data suitable for evaluation (calibration and/or verification); (5) performing a calibration which may include comparing the calculated measurement values to an expected value or range of values; and (6) reporting the result of the calibration (comparison).

Figure 11:
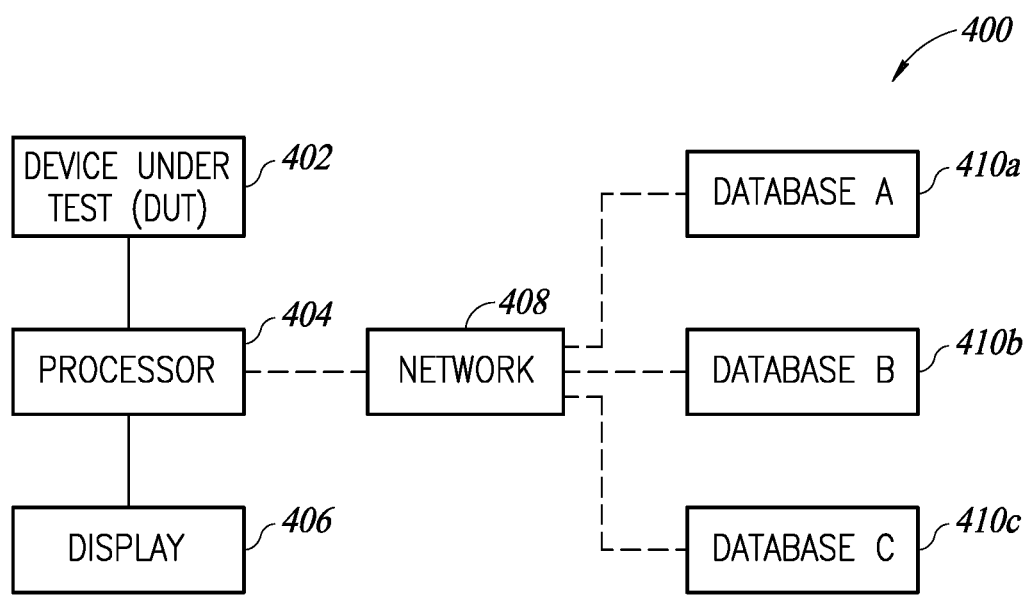
FIG. 11 is a block diagram illustrating a system for carrying out a universal calibration process as described herein.

FIG. 11 shows a block diagram of a system 400 including various example components for carrying out the universal calibration process 243 of the present disclosure. The system 400 includes a DUT 402, a processor 404 in communication with the DUT 402, and a display 406 in communication with the processor 404. For example, the DUT 402 communicates an input signal, which may be representative of a measured property or quantity, to the processor 404, which the processor 404 receives and processes. The processor 404 then communicates an output signal to the display 406 in response to the input signal from the DUT 402. For example, the output signal may be a control signal or instruction signal such that the display 406 displays a measured quantity or property (e.g., automatically) based on the input signal processed by the processor 404. For example, when the DUT 402 is a precision balance, the display 406 may receive the output signal at which point the display 406 may display a measured weight based on the output signal received by the display 406 from the processor 404.

The processor 404 may be in communication with a plurality of databases 410a, 410b, 410c via a network 408, which databases may be at differing locations. For example, a first database 410a may be at a first OEM at a first location, a second database 410b may be at a second OEM at a second location, and a third database 410c is at a third OEM at a third location. The first, second, and third locations may be different from each other such that the first, second, and third locations are miles apart from each other. The first OEM may manufacture a first type of DUT, the second OEM may manufacture a second type of DUT, and the third OEM may manufacture a third type of DUT. The first, second, and third types of DUTs may be different from each other (e.g., torque wrench, precision balance, pipette, pressure transducer, etc.).

The system 400 may be utilized to carry out the universal calibration process 243 for the DUT 402. For example, when the DUT 402 is a precision balance as in FIGS. 6 and 7, the processor 404 is utilized to calibrate the DUT 402. The universal calibration process 243 with respect to the system 400 will be discussed in more detail with respect to FIGS. 6A and 6B as follows.

In this process, the DUT 402 is communicatively coupled to the processor 404 by an end user who is calibrating the DUT 402. After the DUT 402 is coupled to the processor 404, the end user may interact with the processor 404, which may be a computer, a smartphone, a tablet, or some other type of local or remote electronic device, to indicate the DUT 402 being calibrated is of a particular type. For example, the end user may input identification information (a serial number, a part number, or some other type of identifying information) for the DUT 402. Alternatively, the universal calibration process 243 may automatically detect and determine the identification information for the DUT 402.

After the DUT 402 has been identified, the processor 404 communicates through the network 408 with at least one of the plurality of databases 410a, 410b, 410c. For example, the processor 404 may request a calibration specification for the DUT 404 within the first database 410a. The first database 410a is controlled by the first OEM that manufactures the DUT 404, which in this instance is a particular type of precision balance. In at least some implementations, the processor 404 may access the particular specification data from one or more local or remote storage locations.

The calibration specification for the DUT 402 in the first database 410a is transmitted through the network 408 to the processor 404. The specification of the DUT 402 is then received and the specification is processed by the processor 404 to generate a corresponding calibration data sheet based on a measurement methodology within the specification.

The calibration data sheet generated by the processor 404 is transmitted to the display 406 such that the calibration data sheet is visible by the end user on the display 406. The end user may select the calibration tests to be carried out to calibrate the DUT 402 (e.g., mass accuracy test, repeatability test, off-center shift test, etc.), and the end user may then determine the necessary measurements to be taken by the DUT 402. In this example, the calibration data sheet presented on the display 406 is the calibration data sheet 278. The end user then places a 50 g weight onto the DUT 402. The measurement output by the DUT 402 may be automatically communicated to the processor 404, and, in response, the measurement is entered into a corresponding data field within the "indications" field 282. Alternatively, the end user may input the measurements output by the DUT 402 manually into the data fields within the "indications" field 282 of the calibration data sheet 278.

After the data fields of the indication fields 282 have been filled in, the processor 404 performs the further steps of the universal calibration process 243 and automatically fills in the remainder of the calibration data sheet. The processor 404 then reviews the data and calculations displayed in the calibration data sheet 278 and determines whether the DUT 402 is calibrated or is out of tolerance. When the DUT 402 is calibrated, the processor 404 outputs a signal such that the checkmark 298 (calibration indicator) is displayed on the display 406 indicating the DUT 402 is calibrated. Alternatively, when the DUT 402 is not calibration (out of tolerance), the processor 404 outputs a red "cross" (e.g., "X") indicating the DUT 402 is not calibrated.

When the DUT 402 is determined to be not calibrated, the processor 404 may determine a calibration factor to be programmed into the DUT 402 and direct application of the calibration factor to the DUT 402 such that the DUT is calibrated. The processor 404 may calculate the calibration factor such that a raw measured indication measured by the DUT 402 may have the calibration factor applied before the measurement is output on a display of the DUT 402 to an end user. The calibration factor applied to the raw measured indication before being displayed to the end user allows for a measured indication output by the DUT and visible to the end user to be corrected within desired tolerances. In other words, the calibration factor takes into account the current state of the DUT 402 and corrects the raw measured indications measured by the DUT 402 such that the DUT 402 is properly calibrated and is outputting correct measurements.

The data fields that may be filled in by the processor may include a nominal value(s), an expected value(s), an applied value(s), a measured indication(s), a calculated value(s), or any number of values such that an end user may review in detail for auditability and traceability of components utilized in calibrating a DUT. For example, these values may be displayed for a first component and a second component that are utilized with the DUT to calibrate the DUT. These values may be also displayed for the DUT, all within the same calibration data sheet for auditability and traceability proposes. The end user may readily review the nominal value(s), the expected value(s), the applied value(s), the measured indication(s), the calculated value(s) displayed (e.g., on the display 406) to quickly and easily determine whether the DUT being calibrated has been properly calibrated and has not instead been miss-calibrated due to errors while the universal calibration process 243 is carried out.

In another situation, in which the DUT 402 is a pressure transducer and is being calibrated as shown in FIGS. 8 and 9, the processor 404 may request multiple specifications for multiple components from multiple databases to generate the calibration data sheet 320 as shown in FIGS. 9A and 9Bs. For example, the processor 404 may request and receive a specification for the pressure controller 314 from the second database 410b, may request and receive a specification for the voltmeter 318 from the third database 410c, may request and receive a specification for the shunt resistor 316 from the third database 410c, and may request and receive a specification for the DUT 312, which as discussed earlier is the pressure transducer, from the first database 410a. The processor 404 may then process these multiple specification for these multiple components and then generate the calibration data sheet 320 as shown in FIGS. 9A and 9B based on the calibration test to be carried out when performing the universal calibration process 243.

The processor 404 may readily receive data collected by the voltmeter 318 which is then displayed in the "indications" field 282 of the calibration data sheet 312. These indications from the voltmeter 318 have the correction $K_2$ applied to the indications to calculate corrected indications. These corrected indications are then displayed in the "corrections" field 284. After the corrected indications have been calculated, the conversion $C_2$ is applied to the corrected indications to calculate converted indications that are displayed in the "conversions" field 286. The display of the indications measured by the voltmeter 318, the corrected indications determined from the indications of the voltmeter 318, and the converted indications determined from the corrected indications of the voltmeter 318 allows an end user to review the accuracy of the voltmeter 318 while being utilized to calibrate the DUT 312. In other words, the end user may readily review this information related to the voltmeter 318 to determine if the voltmeter 318 is performing accurately and within tolerances as expected. This allows the end user to perform a step-by-step audit and/or tracing of any calibration measurement being performed by any component being utilized to calibrate the DUT 312. In other words, if the voltmeter 318 is not performing within appropriate tolerances as determined by the end users review of the information with respect to the voltmeter 318, the end user may determine that the voltmeter 318 must be replaced by another voltmeter that is working within appropriate tolerances to determine whether the DUT 312 is calibrated. When the voltmeter 318 is out of tolerance, the voltmeter 318 may need to be replaced as utilizing the out of tolerance voltmeter 318 to calibrate the DUT 312 may result in a false indication that the DUT 312 is calibrated when instead the DUT 312 is not calibrated.

While the above discussion is with respect to the generation of the calibration data sheets 278 and 320 shown in FIGS. 6 and 9, respectively, it will be readily appreciated that the above discussion may readily apply to the calibration data sheets 310 and 324 as shown in FIGS. 7 and 10, respectively.

The system 400 as shown in FIG. 11 allows for improved processing speed by the processor 404 in terms of computer functionality when the processor 404 is being utilized to carry out the universal calibration processes 243 as shown in FIGS. 4A and 4B. The processing speed of the processor 404 is faster in performing the universal calibration process 243 as compared to utilizing other calibration methodologies because, as the processor 404 carries out the universal calibration process 243, the same steps successively are followed regardless of the type of the DUT being calibrated. The processing speed is faster as no special tests, add-ons, and/or other various types of workarounds are performed or developed to calibrate any particular type of DUT. Instead, the processor 404 performs and carries out the same steps for a first type of DUT (e.g., precision balance) and performs the same steps for a second different type of DUT (e.g., torque wrench) when calibrating either the first type of DUT or the second type of DUT. The processor 404 performing the same pre-programmed steps of the universal calibration process 243 regardless of the type of DUT being calibrated allows the speed of the processor 404 to be optimized by reducing the number of steps to be directed to the commonalities between different types of calibration tests for different types of DUTs. Accordingly, the universal calibration process 243 is optimized to increase the processing speed of the processor 404 when conducting the universal calibration process 243 relative to when the processor 404 is conducting other types of specialized calibration processes only adapted for being utilized for a single, particular type of DUT.

The system 400 shown in FIG. 11 allows for memory (e.g., memory storage space) requirement to be dispersed across the plurality of databases 410a, 410b, 410c. For example, instead of storing all calibration data sheets for various numbers and types of DUTs in a single memory or storage device from the plurality of databases 410a, 410b, 410c, the calibration sheets are stored across the first, second, and third databases 410a, 410b, 410c, respectively. The first database 410a may be present at a first OEM that stores calibration data sheets for DUTs that the first OEM manufactures and produces, the second database 410b may be present at the second OEM that stores calibration data sheets for DUTs that the second OEM manufactures and produces, and the third database 410c may be present at a third OEM that stores calibration data sheets for DUTs that the third OEM manufactures and produces. The dispersion of all of these calibration data sheets across the plurality of databases 410a, 410b, 410c allows for the speed of the processor 404 to be sped up as the processor 404 may communicate with only one of the plurality of databases 410a, 410b, 410c such that the processor 404 does not review all of the calibration datasheets in all of the plurality of databases 410a, 410b, 410c. This allows the speed at which the processor 404 is capable of reviewing and collecting the appropriate calibration data sheet for the particular type of DUT to be faster relative to the processor having to review all of the calibration databases in all of the plurality of databases 410a, 410b, 410c.

The plurality of databases 410a, 410b, 410c reduce a network bandwidth required by the network 408 as the network may only have to communicate with a single one of the plurality of databases 410a, 410b, 410c when carrying out the universal calibration process 243 for a particular type of DUT. For example, if the DUT is a particular type of precision balance manufactured only by the first OEM, the network 408 may only communicate with the first database 410a, collect the calibration data sheet from the first database 410a, and transmit the corresponding calibration data sheet to the processor 404. Accordingly, the network 408 only has to sift through the first database 410a that includes only some of the calibration data sheets instead of having to sift through all of the calibration data sheets in all of the plurality of databases 410a, 410b, 410c. The dispersion of the calibration data sheets across the plurality of databases 410a, 410b, 410c, reduces the power requirements at a location at which the end user is present and at each location corresponding to each one of the plurality of databases 410a, 410b, 410c.

The system 400 allows for end users to perform the universal calibration process 243 for a particular type of DUT that the end user is calibrating by obtaining from the plurality of databases 410a, 410b, 410c a corresponding calibration data sheet without having to store the calibration data sheet for the particular type of DUT locally. The end user may instead pull the calibration data sheet for the particular type of DUT from the corresponding one of the plurality of databases 410a, 410b, 410c. This increases the speed at which the universal calibration process 243 may be carried out as the end user may not be required to collect and save locally multiple calibration data sheets for particular types of DUTs being calibrated.

The universal calibration process 243 is capable of calibrating any number of different types of DUTs. For example, as described herein, the universal calibration process 243 may be utilized to calibrate different types of DUTs such as a precision balance, a torque wrench, a pressure gauge, a pressure transducer, or any other type of different types of DUTs for measuring different types of quantities. For example, a mass accuracy test for the precision balance may be carried out utilizing the universal calibration process 243 whereas a precision test for a pipette may be carried out utilizing the same universal calibration process 243 disclosed herein. In other words, the universal calibration process 243 may be carried out to calibrate any number of different types of DUTs without having to create special tests, add-ons, and/or various types of workarounds to existing routine calibration processes that are neither ideal nor sustainable over the long term.

The applied values that are applied to the different types of DUTs will depend on the measurements provided by the different types of DUTs. For example, the applied value for calibration of the precision balance 280 is a weight of 50-grams (g) in the example shown in FIGS. 7A and 7B, whereas the applied value for calibration of the pressure transducer 312 is a pressure of a 75-pounds-per-square-inch (psi) applied by a known pressure source. Accordingly, the parameter having the applied value is determined by the type of calibration test being performed utilizing the universal calibration process 243 and on the type of DUT being calibrated.

Accordingly, in view of the description provided herein, a method for calibration of devices may be summarized, for example, as including receiving, by a processor, identifications of at least two devices that are configured to measure different physical or electrical properties; determining, by the processor, different calibration processes for the at least two devices based on respective calibration specifications and measurement models for the at least two devices; applying, by the processor, a device-agnostic evaluation process to evaluate outputs of the different calibration processes for the at least two devices without regard to the identifications of the at least two devices; and outputting, by the processor, respective calibration indicators indicating respective calibration states of the at least two devices.

In some cases, applying the device-agnostic evaluation process may, for example, include receiving a measured indication from a device under test (DUT) of the at least two devices, wherein the measured indication represents a measurement by the DUT of a physical or electrical property having a calibration threshold; determining a corrected indication based on application of a correction factor to the measured indication; determining a converted indication based on application of a conversion factor to the corrected indication; applying a measurement function to the converted indication to determine an output quantity; and determining at least one of the respective calibration indicators based on a comparison of the output quantity to the calibration threshold.

The method may further comprise, based on the identifications of the at least two devices, obtaining the respective calibration specifications and measurement models for the at least two devices; determining the calibration threshold, the correction factor, or the conversion factor based on the respective calibration specification for the DUT; and determining the measurement function based on the respective measurement model for the DUT. When the one of the respective calibration indicators indicates that the DUT is not calibrated, the method may further comprise determining a calibration factor for the DUT, and directing application of the calibration factor to the DUT such that the DUT is calibrated.

The method may further comprise obtaining the calibration threshold from the respective calibration specification for the DUT, and directing application of at least one parameter of a known value to the DUT for measurement by the DUT to produce the measured indication.

The method may further comprise receiving from the respective calibration specification for the DUT, at least one parameter having a known value for measurement by the DUT, and determining the calibration threshold, wherein the calibration threshold is a lower limit that is equal to or less than the known value or is an upper limit that is equal to or greater than the known value.

The comparison of the output quantity to the calibration threshold may include utilizing at least one of a direct measurement comparison, an indirect measurement comparison, a ratio measurement comparison, a differential measurement comparison, a transfer measurement comparison, or a substitution measurement comparison.

The method may further comprise enabling an audit of the device-agnostic evaluation process by recording all applied values, measurement indications, corrected indications, converted indications, measurement functions, and output quantities in the device-agnostic evaluation process.

The method may further comprise receiving, by the processor, a specification for a component coupled to a device under test (DUT) of the at least two devices, and monitoring, by the component, a characteristic of the DUT.

In some cases, applying the device-agnostic evaluation process may include, for example, receiving measured indications from a device under test (DUT) of the at least two devices, wherein the measured indications represent measurements by the DUT of a physical or electrical property; determining a set of statistics from the measured indications or from corrected indications or converted indications determined using the measured indications; and determining at least one of the respective calibration indicators based on a comparison of one or more statistics in the set of statistics to a calibration threshold.

In some cases, applying the device-agnostic evaluation process may include, for example, receiving measured indications from a device under test (DUT) of the at least two devices for at least two different calibration processes of the DUT, wherein the measured indications represent measurements by the DUT of a physical or electrical property having respective calibration thresholds for the at least two different calibration processes, wherein a calibration process of the at least two different calibration processes comprises: determining a corrected indication based on application of a correction factor to a measured indication pertaining to the calibration process; determining a converted indication based on application of a conversion factor to the corrected indication; applying a measurement function to the converted indication to determine an output quantity; and determining at least one of the respective calibration indicators based on a comparison of the output quantity to the respective calibration threshold for the calibration process.

In view of the foregoing description, another method may be summarized, for example, as including receiving, by a processor, measured indications from at least two devices that are configured to measure different physical or electrical properties, wherein the measured indications represent measurements by the at least two devices of different physical or electrical properties; without regard to identification of the at least two devices, determining, by the processor, a common set of statistics for each device of the at least two devices, wherein the common set of statistics for each device is determined from the measured indications received from each device or from corrected indications or converted indications determined using the measured indications; determining, by the processor, respective calibration processes for the at least two devices based on respective calibration specifications and measurement models for the at least two devices, wherein the respective calibration processes are different from each other; and for a device under test (DUT) of the at least two devices: evaluating, by the processor, one or more statistics of the common set of statistics for the DUT according to the respective calibration process for the DUT to determine a calibration state of the DUT; and outputting, by the processor, a calibration indicator indicating the calibration state of the DUT.

In some cases, the common set of statistics includes at least two statistics comprised of a mean, a minimum, a maximum, a standard deviation, a variance, a span, a mode, a midrange, or a coefficient of variation.

In some cases, the measured indications received by the processor represent physical or electrical properties that are measured by the at least two devices in accordance with the respective calibration specifications for the at least two devices.

In some cases, determining the respective calibration processes for the at least two devices includes determining respective calibration thresholds that are used by the processor to evaluate the one or more statistics of the common set of statistics to determine the calibration state of the DUT. In some cases, for the DUT, the measured indications received from the DUT represent measurements by the DUT of a physical or electrical property having a known value, wherein determining the respective calibration threshold for the DUT includes determining a lower limit that is equal to or less than the known value or an upper limit that is equal to or greater than the known value.

In some cases, evaluating the one or more statistics of the common set of statistics for the DUT includes comparing the one or more statistics to a respective calibration threshold for the DUT.

In some cases, comparing the one or more statistics to the respective calibration threshold includes utilizing at least one of a direct measurement comparison, an indirect measurement comparison, a ratio measurement comparison, a differential measurement comparison, a transfer measurement comparison, or a substitution measurement comparison.

In some cases, determining the common set of statistics for each device of the at least two devices includes determining corrected indications for each device based on application of a correction factor to measured indications received from the device; determining converted indications for each device based on application of a conversion factor to the corrected indications; and applying a measurement function to the converted indications to determine at least one statistic in the common set of statistics.

In some cases, the respective measurement models for the at least two devices include one or more measurement functions that are used by the processor to determine one or more statistics in the common set of statistics.

The various embodiments described above can be combined to provide yet further embodiments. Aspects of the embodiments can be modified, if necessary, to provide yet further embodiments. These and other changes can be made to the embodiments described herein in light of the above-detailed description.

The invention claimed is:

1. A method for calibrating devices, comprising:
receiving, by a processor, an identification of at least a first device and an identification of at least a second device, wherein the first and second devices are configured to measure different physical or electrical properties;
determining, by the processor, calibration processes for the first and second devices based on respective calibration specifications and measurement models for the first and second devices, wherein the calibration processes for the first and second devices are different;
applying, by the processor, a device-agnostic evaluation process to evaluate outputs of the calibration processes for the first and second devices, wherein the device-agnostic evaluation process does not depend on the identifications of the first and second devices; and
outputting, by the processor, respective calibration indicators indicating respective calibration states of the first and second devices based on results of the device-agnostic evaluation process.

2. The method of claim 1, wherein applying the device-agnostic evaluation process includes:
receiving a measured indication from a device under test (DUT) that is at least one of the first device or the second device, wherein the measured indication represents a measurement by the DUT of a physical or electrical property having a calibration threshold;
determining a corrected indication based on application of a correction factor to the measured indication;
determining a converted indication based on application of a conversion factor to the corrected indication;
applying a measurement function to the converted indication to determine an output quantity; and
determining at least one of the respective calibration indicators based on a comparison of the output quantity to the calibration threshold.

3. The method of claim 2, further comprising:
based on the identifications of the first and second devices, obtaining the respective calibration specifications and measurement models for the first and second devices;
determining the calibration threshold, the correction factor, or the conversion factor based on the respective calibration specification for the DUT; and
determining the measurement function based on the respective measurement model for the DUT.

4. The method of claim 2, further comprising, when the at least one of the respective calibration indicators indicates that the DUT is not calibrated:
determining a calibration factor for the DUT; and
directing application of the calibration factor to the DUT such that the DUT is calibrated.

5. The method of claim 2, further comprising:
obtaining the calibration threshold from the respective calibration specification for the DUT; and directing application of at least one parameter of a known value to the DUT for measurement by the DUT to produce the measured indication.

6. The method of claim 2, further comprising:
receiving from the respective calibration specification for the DUT, at least one parameter having a known value for measurement by the DUT; and
determining the calibration threshold, wherein the calibration threshold is a lower limit that is equal to or less than the known value or is an upper limit that is equal to or greater than the known value.

7. The method of claim 2, wherein the comparison of the output quantity to the calibration threshold includes utilizing at least one of a direct measurement comparison, an indirect measurement comparison, a ratio measurement comparison, a differential measurement comparison, a transfer measurement comparison, or a substitution measurement comparison.

8. The method of claim 2, further comprising:
enabling an audit of the device-agnostic evaluation process by recording all applied values, measurement indications, corrected indications, converted indications, measurement functions, and output quantities in the device-agnostic evaluation process.

9. The method of claim 1, further comprising:
receiving, by the processor, a specification for a component coupled to a device under test (DUT) that is at least one of the first device or the second device; and
monitoring, by the component, a characteristic of the DUT.

10. The method of claim 1, wherein applying the device-agnostic evaluation process includes:
receiving measured indications from a device under test (DUT) that is at least one of the first device or the second device, wherein the measured indications represent measurements by the DUT of a physical or electrical property;
determining a set of statistics from the measured indications or from corrected indications or converted indications determined using the measured indications; and
determining at least one of the respective calibration indicators based on a comparison of one or more statistics in the set of statistics to a calibration threshold.

11. The method of claim 1, wherein applying the device-agnostic evaluation process includes:
receiving measured indications from a device under test (DUT) that is at least one of the first device or the second device for at least two different calibration processes of the DUT, wherein the measured indications represent measurements by the DUT of a physical or electrical property having respective calibration thresholds for the at least two different calibration processes,
wherein a calibration process of the at least two different calibration processes comprises:
determining a corrected indication based on application of a correction factor to a measured indication pertaining to the calibration process;
determining a converted indication based on application of a conversion factor to the corrected indication;
applying a measurement function to the converted indication to determine an output quantity; and determining at least one of the respective calibration indicators based on a comparison of the output quantity to the respective calibration threshold for the calibration process.

12. A method for calibrating devices, comprising:

receiving, by a processor, measured indications from at least two devices that are configured to measure different physical or electrical properties, wherein the measured indications represent measurements by the at least two devices of different physical or electrical properties;

determining, by the processor, a common set of statistics for each device of the at least two devices, wherein the common set of statistics for each device is not dependent on identification of the device and is determined from the measured indications received from the device or from corrected indications or converted indications determined using the measured indications;

determining, by the processor, respective calibration processes for the at least two devices based on respective calibration specifications and measurement models for the at least two devices, wherein the respective calibration processes are different from each other; and for a device under test (DUT) of the at least two devices:
evaluating, by the processor, one or more statistics of the common set of statistics for the DUT according to the respective calibration process for the DUT to determine a calibration state of the DUT; and
outputting, by the processor, a calibration indicator indicating the calibration state of the DUT.

13. The method of claim 12, wherein the common set of statistics includes at least two statistics comprised of a mean, a minimum, a maximum, a standard deviation, a variance, a span, a mode, a midrange, or a coefficient of variation.

14. The method of claim 12, wherein the measured indications received by the processor represent physical or electrical properties that are measured by the at least two devices in accordance with the respective calibration specifications for the at least two devices.

15. The method of claim 12, wherein determining the respective calibration processes for the at least two devices includes determining respective calibration thresholds that are used by the processor to evaluate the one or more statistics of the common set of statistics to determine the calibration state of the DUT.

16. The method of claim 15, wherein, for the DUT, the measured indications received from the DUT represent measurements by the DUT of a physical or electrical property having a known value, and wherein determining the respective calibration threshold for the DUT includes determining a lower limit that is equal to or less than the known value or an upper limit that is equal to or greater than the known value.

17. The method of claim 12, wherein evaluating the one or more statistics of the common set of statistics for the DUT includes comparing the one or more statistics to a respective calibration threshold for the DUT.

18. The method of claim 17, wherein comparing the one or more statistics to the respective calibration threshold includes utilizing at least one of a direct measurement comparison, an indirect measurement comparison, a ratio measurement comparison, a differential measurement comparison, a transfer measurement comparison, or a substitution measurement comparison.

19. The method of claim 12, wherein determining the common set of statistics for each device of the at least two devices includes:
determining corrected indications for each device based on application of a correction factor to measured indications received from the device;
determining converted indications for each device based on application of a conversion factor to the corrected indications; and
applying a measurement function to the converted indications to determine at least one statistic in the common set of statistics.

20. The method of claim 12, wherein the respective measurement models for the at least two devices include one or more measurement functions that are used by the processor to determine one or more statistics in the common set of statistics.

* * * * *